US012562217B2

(12) United States Patent (10) Patent No.: US 12,562,217 B2
Yoon et al. (45) Date of Patent: Feb. 24, 2026

(54) MEMORY DEVICE AND A DRIVING METHOD OF A SENSING DEVICE INCLUDED IN THE MEMORY DEVICE

(71) Applicant: SAMSUNG ELECTRONICS CO., LTD., Suwon-si (KR)

(72) Inventors: Hyun-Chul Yoon, Suwon-si (KR); Youngcheol Chae, Seoul (KR)

(73) Assignees: SAMSUNG ELECTRONICS CO., LTD., Suwon-si (KR); UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 103 days.

(21) Appl. No.: 18/661,809

(22) Filed: May 13, 2024

(65) Prior Publication Data

US 2024/0428847 A1 Dec. 26, 2024

(30) Foreign Application Priority Data

Jun. 20, 2023 (KR) ........................ 10-2023-0078783
Oct. 25, 2023 (KR) ........................ 10-2023-0143896

(51) Int. Cl.
*G11C 11/4091* (2006.01)
*G11C 11/4074* (2006.01)
*G11C 11/4094* (2006.01)

(52) U.S. Cl.
CPC ...... *G11C 11/4091* (2013.01); *G11C 11/4074* (2013.01); *G11C 11/4094* (2013.01)

(58) Field of Classification Search
CPC ............ G11C 11/4091; G11C 11/4074; G11C 11/4094
See application file for complete search history.

(56) References Cited

U.S. PATENT DOCUMENTS 6,594,187 B2 7/2003 Ito
7,619,939 B2 * 11/2009 Kajitani .............. G11C 11/4076
365/207

(Continued)

FOREIGN PATENT DOCUMENTS

KR 10-2003-0057724 A 7/2003
KR 10-2004-0074837 A 8/2004
KR 10-2023-0067461 A 5/2023

OTHER PUBLICATIONS

Office Action issued in corresponding Korean application No. KR 10-2023-0143896 on Jan. 31, 2025.

*Primary Examiner* — Min Huang
(74) *Attorney, Agent, or Firm* — MORGAN, LEWIS & BOCKIUS LLP

(57) ABSTRACT

A memory device including: a memory cell array including a first memory cell connected to a bit line, and a second memory cell connected to a complementary bit line; a bit line sense amplifier including a sensing bit line and a sensing complementary bit line; a first charge transfer transistor between the bit line and the sensing bit line; a second charge transfer transistor between the complementary bit line and the sensing complementary bit line; a first pre-charge transistor pre-charging the bit line and the complementary bit line with a first pre-charge voltage; a second pre-charge transistor pre-charging the sensing bit line and the sensing complementary bit line with a second pre-charge voltage; a first transfer gate transistor providing a first transfer gate voltage to the first charge transfer transistor; and a second transfer gate transistor providing a second transfer gate voltage to the second charge transfer transistor.

20 Claims, 29 Drawing Sheets

(56)                    References Cited

U.S. PATENT DOCUMENTS

| | | |
|---|---|---|
| 7,697,357 B2 | 4/2010 | Tomishima |
| 7,876,627 B2 | 1/2011 | Akiyama et al. |
| 2002/0027800 A1 | 3/2002 | Porter et al. |
| 2011/0044121 A1* | 2/2011 | Kim .................... G11C 11/4091 |
| | | 365/207 |
| 2023/0146659 A1* | 5/2023 | Nam ........................ G11C 5/04 |
| | | 365/185.21 |
| 2024/0029782 A1* | 1/2024 | Lee ..................... G11C 11/4091 |

* cited by examiner

FIG. 4

MEMORY DEVICE AND A DRIVING METHOD OF A SENSING DEVICE INCLUDED IN THE MEMORY DEVICE

CROSS-REFERENCE TO RELATED APPLICATIONS

This application claims priority under 35 U.S.C. § 119 to Korean Patent Application No. 10-2023-0078783 filed on Jun. 20, 2023 and Korean Patent Application No. 10-2023-0143896 filed on Oct. 25, 2023 in the Korean Intellectual Property Office, the disclosures of which are incorporated by reference herein in their entireties.

1. TECHNICAL FIELD

The present disclosure relates to a memory device and a method for driving a sensing device included in the memory device.

2. DESCRIPTION OF THE RELATED ART

Semiconductor storage devices are utilized for data storage. A Random Access Memory (RAM) is a type of volatile memory device primarily used as a main memory in computers. A Dynamic Random Access Memory (DRAM), a subset of RAM, is also volatile and consists of memory cells. To efficiently sense the data stored in these cells, a bit line and a complementary bit line are pre-charged with a pre-charge voltage. Following this, a charge sharing operation is performed, leading to a voltage difference between the bit line and the complementary bit line occurs. This voltage difference, referred to as dVBL, is then amplified by a sense amplifier to sense the data stored in the memory cells.

On the other hand, when pre-charging the bit line and the complementary bit line, setting the pre-charge voltage to a ground voltage VSS or a power supply voltage VDD can increase the sensing margin, compared to setting the magnitude of the pre-charge voltage to half the power supply voltage VDD. However, this approach may lead to an imbalance caused by data polarity.

SUMMARY

Embodiments of the present disclosure provide a memory device that can enhance the performance of sensing data stored in memory cells.

Embodiments of the present disclosure also provide a method for driving a sensing device that can improve the performance of sensing data stored in memory cells.

According to an embodiment of the present disclosure, there is provided a memory device including: a memory cell array that includes a first memory cell connected to a bit line, and a second memory cell connected to a complementary bit line; a bit line sense amplifier that includes a sensing bit line connected to the bit line, and a sensing complementary bit line connected to the complementary bit line, wherein the bit line sense amplifier is configured to output a signal of the sensing bit line to the bit line and a signal of the sensing complementary bit line to the complementary bit line to sense data stored in the first memory cell and the second memory cell; a first charge transfer transistor connected between the bit line and the sensing bit line, wherein a gate of the first charge transfer transistor receives a first signal via a first node; a second charge transfer transistor connected between the complementary bit line and the sensing complementary bit line, wherein a gate of the second charge transfer transistor receives a second signal via a second node; a first pre-charge transistor that is configured to pre-charge the bit line and the complementary bit line with a first pre-charge voltage; a second pre-charge transistor that is configured to pre-charge the sensing bit line and the sensing complementary bit line with a second pre-charge voltage different from the first pre-charge voltage; a first transfer gate transistor that is configured to provide a first transfer gate voltage to a gate of the first charge transfer transistor in response to a first control signal; and a second transfer gate transistor that is configured to provide a second transfer gate voltage different from the first transfer gate voltage to a gate of the second charge transfer transistor in response to the first control signal.

According to an embodiment of the present disclosure, there is provided a memory device including: a memory cell array that includes a first memory cell connected to a bit line, and a second memory cell connected to a complementary bit line; a bit line sense amplifier that includes a sensing bit line connected to the bit line, and a sensing complementary bit line connected to the complementary bit line, wherein the bit line sense amplified is configured to output a signal of the sensing bit line and a signal of the sensing complementary bit line to the bit line and the complementary bit line to sense data stored in the first memory cell and the second memory cell; a first charge transfer transistor that is connected between the bit line and the sensing bit line, and is gated by a first signal provided to the first node; a second charge transfer transistor that is connected between the complementary bit line and the sensing complementary bit line, and is gated by a second signal connected to the second node; and a plurality of transfer gate transistors which is configured to provide a first transfer gate voltage to a gate of the first charge transfer transistor, and provide a second transfer gate voltage lower than the first transfer gate voltage to a gate of the second charge transfer transistor, in response to the bit line sense amplifier sensing the data stored in the first memory cell, and is configured to provide the second transfer gate voltage to the gate of the first charge transfer transistor, and provide the first transfer gate voltage to the gate of the second charge transfer transistor, in response to the bit line sense amplifier sensing the data stored in the second memory cell.

According to an embodiment of the present disclosure, there is provided a method for driving a sensing device that is configured to sense data of a first memory cell connected to a bit line, and a second memory cell connected to a complementary bit line, by using a bit line sense amplifier that includes a sensing bit line and a sensing complementary bit line, a first charge transfer transistor connected to the sensing bit line and the bit line, and a second charge transfer transistor connected to the sensing complementary bit line and the complementary bit line, the method including: pre-charging the sensing bit line and the sensing complementary bit line, using a first pre-charge voltage; providing a first transfer gate voltage to a gate of the first charge transfer transistor, and providing a second transfer gate voltage different from the first transfer gate voltage to a gate of the second charge transfer transistor; and applying an isolation voltage greater than a magnitude of each of the first and second transfer gate voltages to the gate of the first charge transfer transistor and the gate of the second charge transfer transistor, and sensing data stored in at least one of the first memory cell and the second memory cell.

BRIEF DESCRIPTION OF THE DRAWINGS

The above and other features of the present disclosure will become more apparent by describing in detail embodiments thereof with reference to the attached drawings, in which:

FIG. 4 is a diagram showing a memory device including a sensing device according to some embodiments.

DETAILED DESCRIPTION OF THE EMBODIMENTS

Hereinafter, a memory device and a method of driving a sensing device included in the memory device according to some embodiments will be described with reference to the accompanying drawings.

Figure 1:
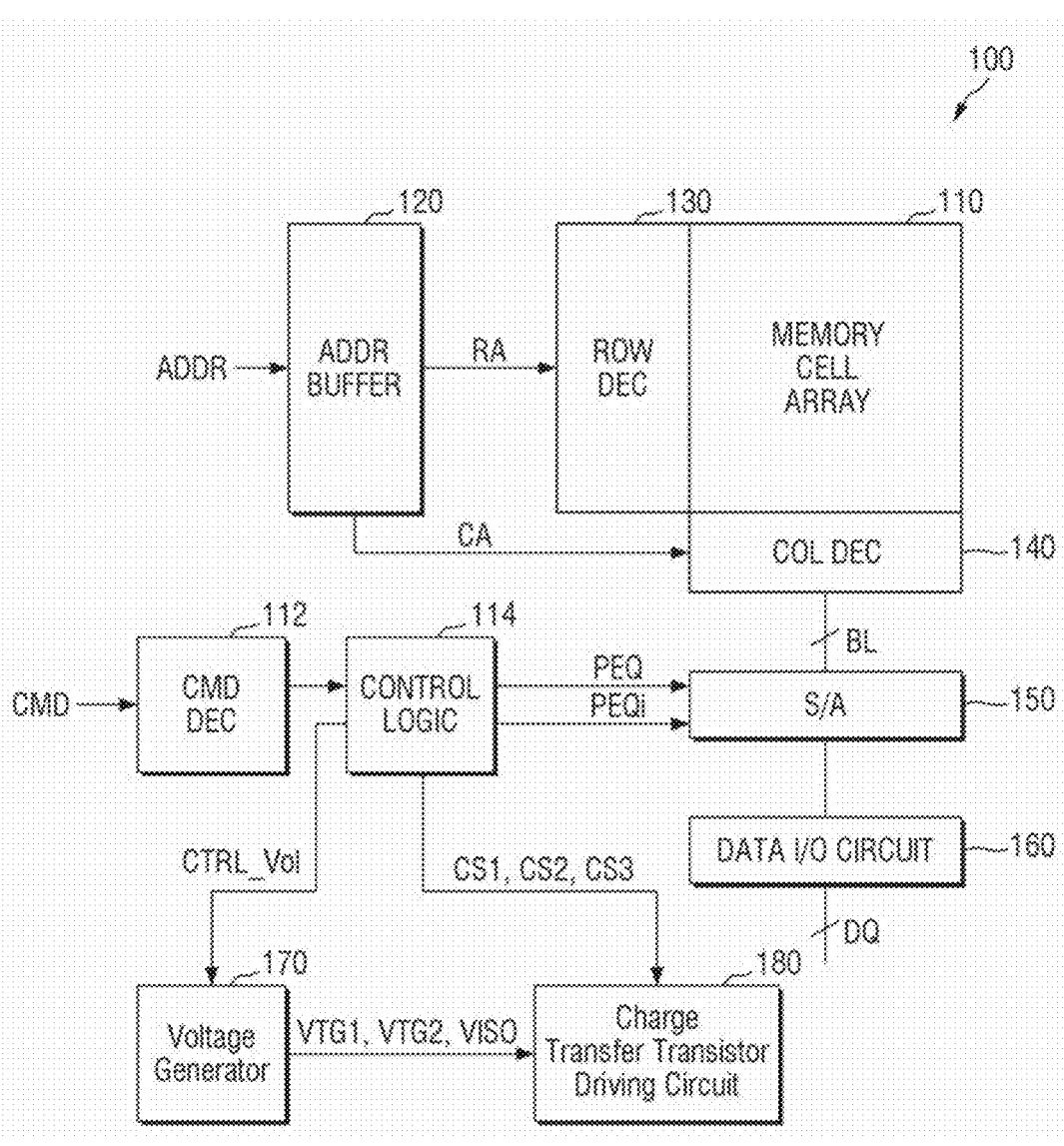
FIG. 1 is a block diagram for explaining a memory device according to some embodiments.

FIG. 1 is a block diagram for explaining a memory device according to some embodiments.

Referring to FIG. 1, a memory device 100 may be a memory device based on a semiconductor element. For example, the memory device 100 may be a Dynamic Random Access Memory (DRAM) such as a Double Data Rate Static DRAM (DDR SDRAM), a Single Data Rate SDRAM (SDR SDRAM), a Low Power DDR SDRAM (LPDDR SDRAM), a Low Power SDR SDRAM (LPSDR SDRAM), and a Direct Rambus DRAM (RDRAM) or may be any volatile memory device. In particular, the memory device 100 may be a device to which standard regulations such as DDR4 or DDR5 are applied.

In an embodiment, the number of data pins to which DDR4 or DDR5 standard regulations are applied may be 4, 8, or 16, and the number of data pins of the memory device 100 according to the present disclosure may be 16. Hereinafter, the description of the number of data pins of the memory device 100 used in the description of this specification may be applied in accordance with the standard regulations for the dynamic random access memory, but is not necessarily limited thereto.

The memory device 100 may output data through data lines DQ in response to a command CMD, an address ADDR, and control signals received from an external device, for example, a memory controller. The memory device 100 may include a memory cell array 110, a command decoder 112, a control logic 114, an address buffer 120, a row decoder 130, a column decoder 140, a sense amplifier array 150, a data input/output circuit 160, a voltage generator 170, and a charge transfer transistor driving circuit 180.

The memory cell array 110 includes a plurality of memory cells provided in the form of a matrix arranged in rows and columns. The memory cell array 110 includes a plurality of word lines WL and a plurality of bit lines BL connected to the memory cells. The plurality of word lines WL may be connected to rows of the memory cells, and the plurality of bit lines BL may be connected to columns of the memory cells.

According to some embodiments, the memory cells may include a normal memory cell and a redundant memory cell that store data. The redundant memory cell is used to rescue a defective normal memory cell.

The command decoder 112 decodes commands received from the memory controller, for example, a write enable signal (/WE), a row address strobe signal (/RAS), a column address strobe signal (/CAS), a chip selection signal (/CS), and the like. The command CMD may include an active command, a read command, a write command, a pre-charge command, and the like.

The control logic 114 may generate various control signals necessary for access operations, for example, a write operation, a read operation, a pre-charge operation, and the like, to the memory cell array 110 in response to the decoded commands. For example, the control logic 114 may generate a pre-charge equalizing signal PEQ and a pre-charge equalizing signal PEQi on the basis of the decoded commands. The control logic 114 may generate a voltage control signal CTRL_Vol and transfer the voltage control signal CTRL_Vol to the voltage generator 170, and may generate control signals CS1, CS2, and CS3 and transfer the control signals CS1, CS2, and CS3 to the charge transfer transistor driving circuit 180. The control signals CS1, CS2, and CS3 generated by the control logic 114 will be described below with reference to FIG. 5 and the like.

The address buffer 120 receives the address ADDR from a memory controller, which is an external device. The address ADDR includes a row address RA that addresses a row of the memory cell array 110, and a column address CA that addresses a column of the memory cell array 110. The address buffer 120 may transfer the row address RA to the row decoder 130, and may transfer the column address CA to the column decoder 140.

The row decoder 130 may select any one of the plurality of word lines WL connected to the memory cell array 110. The row decoder 130 may decode the row address RA received from the address buffer 120, select any one word line corresponding to the row address RA, and activate the selected word line. A high power supply voltage VPP higher than the power supply voltage VDD may be applied to the gate of the access transistor of the memory cell at the time of activation of the word line, in other words, a word line enable operation.

The column decoder 140 may select a certain bit line among the plurality of bit lines BL of the memory cell array 110. The column decoder 140 may decode the column address CA received from the address buffer 120, and select the certain bit line corresponding to the column address CA.

The sense amplifier array (S/A) 150 is connected to the bit lines BL of the memory cell array 110. The sense amplifier array 150 senses a voltage change of the selected bit line of the plurality of bit lines BL, and amplifies and outputs the sensed voltage change. The data input/output circuit 160 may output data that is output from the sense amplifier array 150 on the basis of the sensed and amplified voltage to the outside through the data line DQ.

Although it will be described below with reference to FIG. 3, the sense amplifier array 150 may include a plurality of bit line sense amplifiers BLSA. A bit line sense amplifier BLSA may be connected to a bit line pair including the bit line BL and a complementary bit line BLB to sense and amplify the potential appearing on the bit line. The specific connection between the bit line sense amplifier and the bit line pair will be described below with reference to FIGS. 3 and 4.

The sense amplifier array 150 may receive the pre-charge equalizing signal PEQ and the pre-charge equalizing signal PEQi from the control logic 114. The sense amplifier array 150 may pre-charge the bit line BL and the complementary bit line BLB according to the pre-charge equalizing signal PEQ. The sense amplifier array 150 may pre-charge a sensing bit line SBL and a sensing complementary bit line SBLB according to the pre-charge equalizing signal PEQi. The pre-charge operation will be described below with reference to FIG. 5 or the like.

The voltage generator 170 may generate various types of voltages for performing program, read, and erase operations on the basis of the voltage control signal CTRL_Vol. For example, the voltage generator 170 may generate a transfer gate voltage VTG1, a transfer gate voltage VTG2, and an isolation voltage VISO necessary for the sensing operation of the bit line sense amplifier BLSA included in the sense amplifier array 150, and provide the voltages VTG1, VTG2 and VISO to the charge transfer transistor driving circuit 180.

Figure 2:
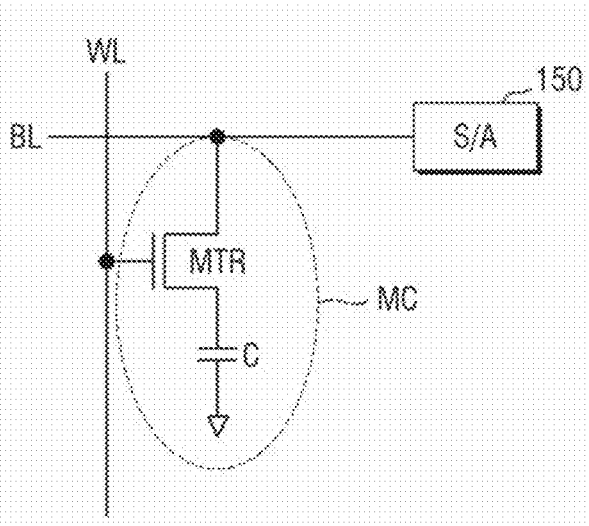
FIG. 2 is a diagram for explaining the memory cell of FIG. 1.

FIG. 2 is a diagram for explaining the memory cell of FIG. 1.

Referring to FIGS. 1 and 2 together, the memory cell MC included in the memory cell array 110 is connected to a word line WL and a bit line BL.

The memory cell MC consists of a cell transistor MTR and a cell capacitor C. The memory device 100 may perform a read operation or a refresh operation on the basis of the amount of charge in the cell capacitor C included in the memory cell MC. For example, the bit line BL connected to the memory cell MC is pre-charged with the pre-charge voltage VBL. Thereafter, as the word line WL is activated, a charge sharing operation occurs between the charges of the bit line BL charged with the pre-charge voltage VBL and the charges of the cell capacitor C of the memory cell MC. Due to the charge sharing operation, the voltage of the bit line BL may decrease or increase by a voltage change amount V from the pre-charge voltage VBL. Each of the bit line sense amplifiers BLSA in the sense amplifier array 150 may sense the voltage change amount V and amplify the voltage change amount V.

Figure 3:
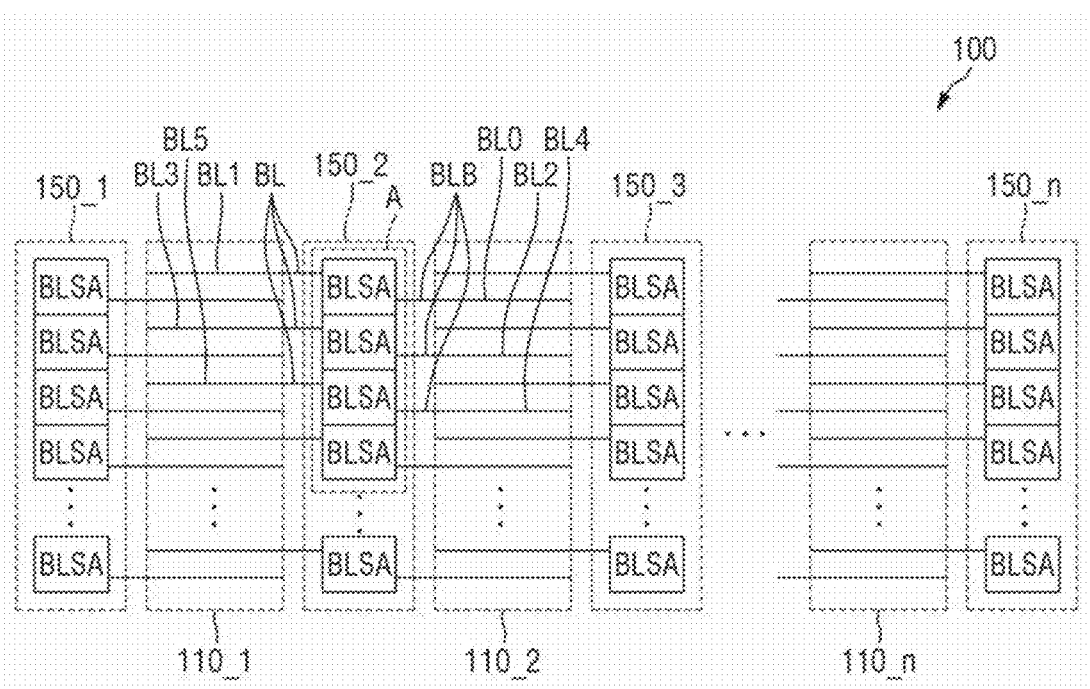
FIG. 3 is a diagram for explaining a memory cell array to which the bit line sense amplifier according to some embodiments is applied.

FIG. 3 is a diagram for explaining a memory cell array to which the bit line sense amplifier according to some embodiments is applied.

Referring to FIG. 3, the memory device 100 includes a plurality of memory cell arrays 110_1 to 110_n and a plurality of bit line sense amplifiers 150_1 to 150_n.

Each of the plurality of bit line sense amplifiers 150_1 to 150_n may include a plurality of bit line sense amplifiers BLSA. Each of the plurality of bit line sense amplifiers BLSA may be implemented as the sense amplifier array 150 described in FIGS. 1 and 2.

The plurality of bit line pairs BL and BLB connected to the plurality of memory cell arrays 110_1 to 110_n may be connected to the plurality of bit line sense amplifiers BLSA, respectively. As will be described below with reference to FIG. 5, each bit line sense amplifier BLSA may be a cross-coupled differential sense amplifier implemented by a P-type sense amplifier and an N-type sense amplifier.

Each of the bit line sense amplifiers BLSA is a circuit element that operates normally at the time of operation of the semiconductor memory device 100. Each of the bit line sense amplifiers BLSA is distinguished from dummy bit line sense amplifiers 150_1 and 150_n implemented in an area other than an area in which the bit line sense amplifiers 150_2 to 150_n−1 are implemented.

According to some embodiments, the odd-numbered bit line of the memory cell array 110_1 may be connected to the bit lines BL, and the even-numbered bit line of the memory cell array 110_1 may be connected to the complementary bit lines BLB. The bit line sense amplifier 150_2 may be connected to each of the bit line pairs BL and BLB in both directions. For example, the bit line sense amplifier 150_2 may be connected to the odd-numbered bit lines (e.g., BL1, BL3, BL5, etc.) of the left memory cell array 110_1, in other words, the bit line BL, and the bit line sense amplifier 150_2 may be connected to the even-numbered bit lines (e.g., BL0, BL2, BL4, etc.) of the right memory cell array 110_2, in other words, the complementary bit line BLB. For example, the odd-numbered bit lines may constitute the bit line BL and the even-numbered bit lines may constitute the complementary bit line BLB.

When the potential of the bit line BL is a high potential in the sensing operation of the bit line sense amplifier BLSA, the potential of the complementary bit line BLB becomes a low potential in the sensing operation of the bit line sense amplifier BLSA. On the other hand, when the potential of the bit line BL is a low potential in the sensing operation of the bit line sense amplifier BLSA, the potential of the complementary bit line BLB becomes a high potential in the sensing operation of the bit line sense amplifier BLSA. In other words, only when a sufficient voltage difference exists between the bit line BL and the complementary bit line BLB, the bit line sense amplifier BLSA may smoothly perform the sensing operation.

The odd-numbered bit lines of the memory cell array 110_2 may extend in a direction opposite to the bit line sense amplifier 150_2, and may be connected to the bit line sense amplifier 150_3.

Figure 4:
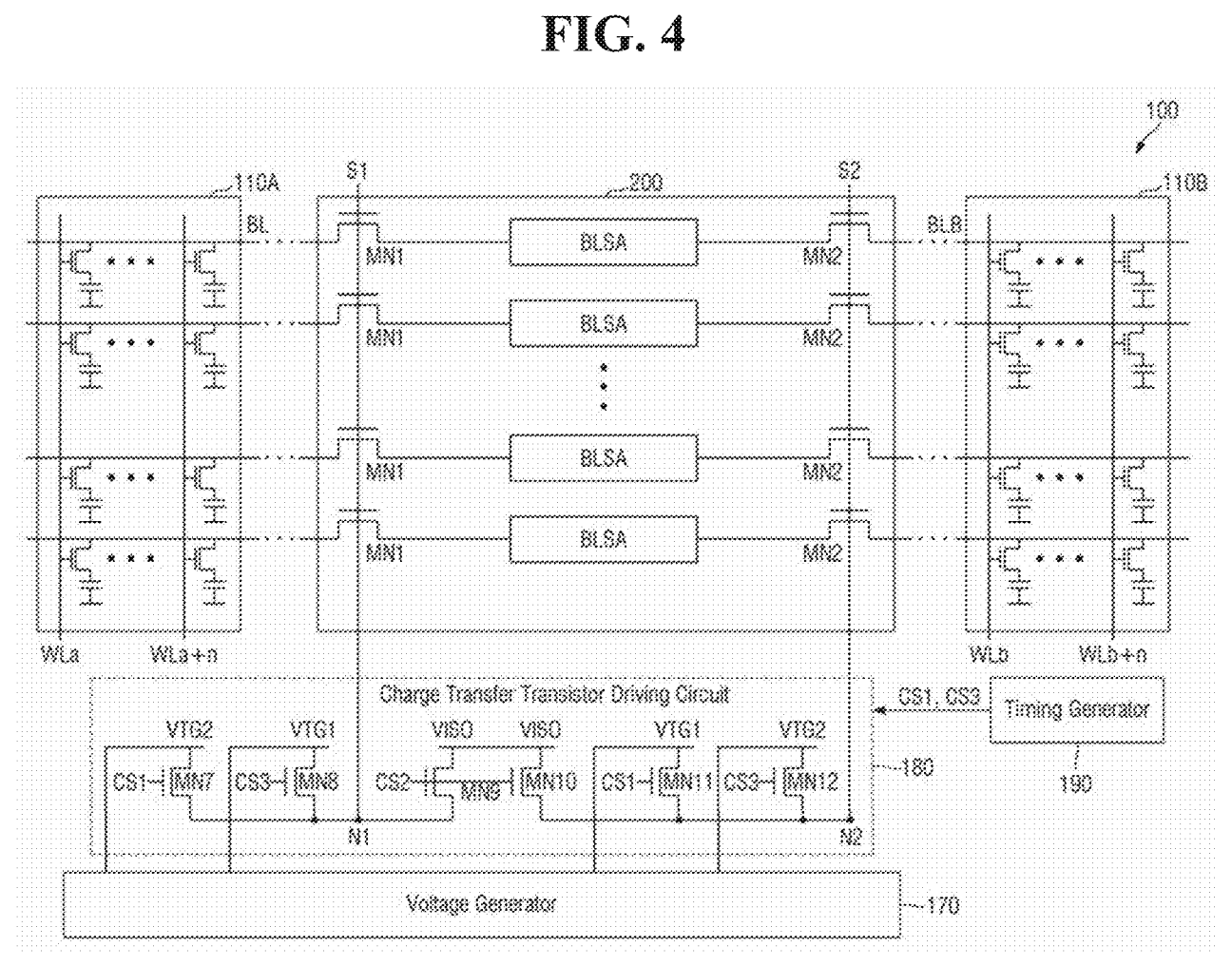
Figure 5:
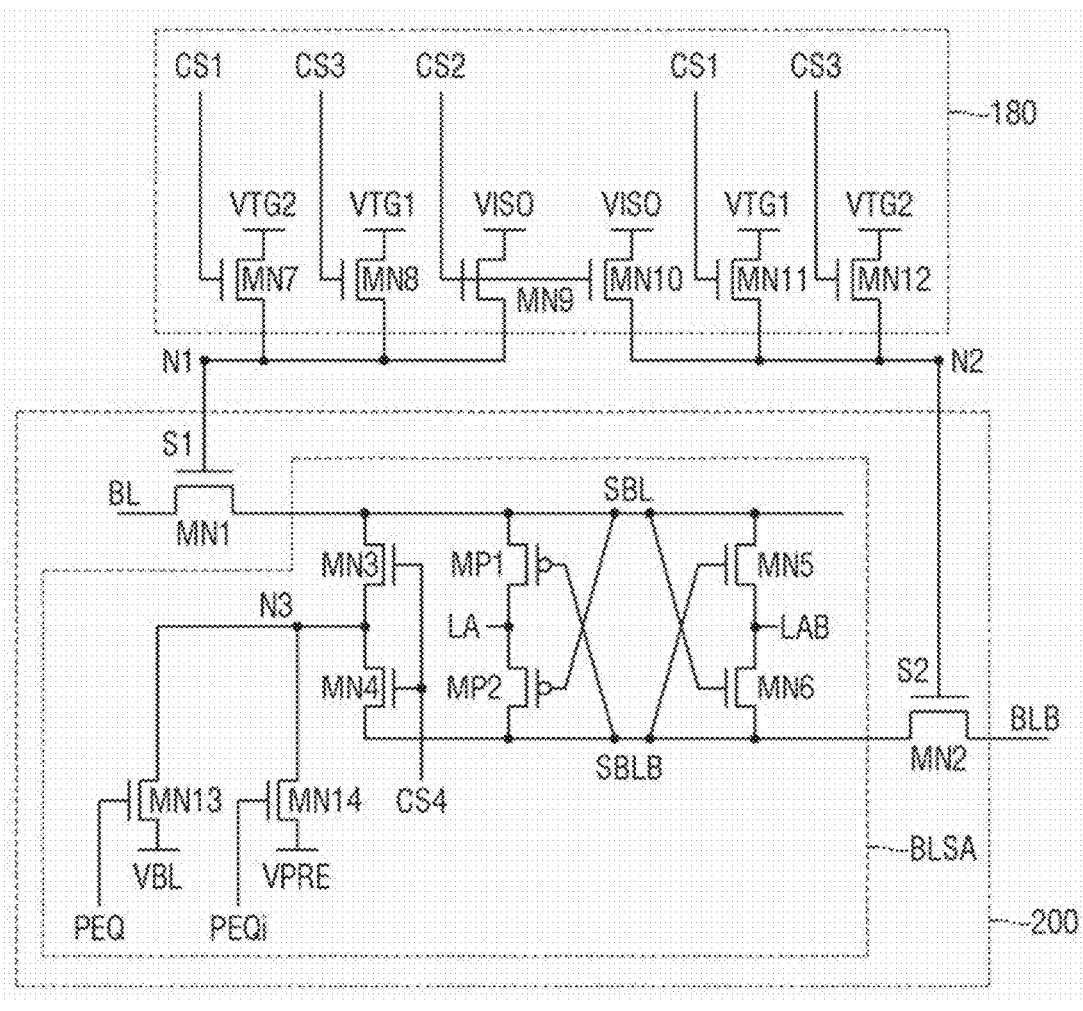
FIG. 5 is a circuit diagram showing the sensing device and the charge transfer transistor driving circuit of FIG. 4.

FIG. 4 is a diagram showing a memory device including a sensing device according to some embodiments. FIG. 5 is a circuit diagram showing the sensing device and the charge transfer transistor driving circuit of FIG. 4. Hereinafter, a memory device including the sensing device according to some embodiments will be described with reference to FIGS. 4 and 5.

Referring first to FIG. 4, the memory device 100 may include a sensing device 200, memory cell arrays 110A and 110B, a voltage generator 170, and a charge transfer transistor driving circuit 180. The sensing device 200 may include at least one bit line sense amplifier BLSA, at least one charge transfer transistor MN1, and at least one charge transfer transistor MN2. Each bit line sense amplifier BLSA may be connected to the charge transfer transistor driving circuit 180 through its charge transfer transistors MN1 and MN2. Word lines WLa to WLa+n may be connected to the memory cell array 110A, and word lines WLb to WLb+n may be connected to the memory cell array 110B.

The charge transfer transistor MN1 may be turned on by signal S1. For example, if the charge transfer transistor MN1 is an N-type transistor, it may be turned on when the signal S1 is logic high. The signal S1 may be logic high or logic low depending on the voltage of node N1. The charge transfer transistor MN2 may be turned on by the signal S2. For example, if the charge transfer transistor MN2 is an N-type transistor, it may be turned on when the signal S2 is logic high. The signal S2 may be logic high or logic low depending on the voltage of node N2.

Hereinafter, one bit line sense amplifier BLSA included in the sensing device 200, and the charge transfer transistor MN1 and the charge transfer transistor MN2 each connected to both ends of the bit line sense amplifier BLSA will be explained as an example. However, the following explanation may be similarly applied to other bit line sense amplifiers BLSA included in the sensing device 200 and the charge transfer transistor MN1 and the charge transfer transistor MN2 each connected to both ends of the other bit line sense amplifiers BLSA.

The memory cell arrays 110A and 110B show some of a plurality of memory cell arrays included in the memory device 100, and the memory device 100 may further include a plurality of memory cell arrays, in addition to the memory cell arrays 110A and 110B. The memory cell arrays 110A and 110B may be two memory cell arrays closest to each other among the plurality of memory cell arrays included in the memory device 100. For example, the memory cell array 110A may be an even-numbered memory cell block, and the memory cell array 110B may be an odd-numbered memory cell block. In another embodiment, the memory cell array 110A may be an odd-numbered memory cell block, and the memory cell array 110B may be an even-numbered memory cell block.

The charge transfer transistor driving circuit 180 may include transfer gate transistors MN7, MN8, MN11, and MN12 and isolation transistors MN9 and MN10. In FIG. 4, the transfer gate transistors MN7, MN8, MN11, and MN12 and the isolation transistors MN9 and MN10 are all shown to be N-type transistors. However, at least one transfer transistor among the transfer gate transistors MN7, MN8, MN11, and MN12 and the isolation transistors MN9 and MN10 included in the charge transfer transistor driving circuit 180 may be implemented as a P-type transistor according to an embodiment.

One end of the transfer gate transistor MN7 may be connected to transfer gate voltage line VTG2, and the other end of the transfer gate transistor MN7 may be connected to the node N1. One end of the transfer gate transistor MN8 may be connected to transfer gate voltage line VTG1, and the other end of the transfer gate transistor MN8 may be connected to the node N1.

One end of the isolation transistor MN9 may be connected to an isolation voltage line VISO, and the other end of the isolation transistor MN9 may be connected to the node N1. In this way, the transfer gate transistors MN7 and MN8 and the isolation transistor MN9 may use the node N1 as a common node. As a result, any one voltage among the transfer gate voltage VTG1, the transfer gate voltage VTG2, and the isolation voltage VISO may be provided to the node N1, and the voltage provided to the node N1 may be provided to the gate of the charge transfer transistor MN1 as the signal S1.

One end of the transfer gate transistor MN11 may be connected to the transfer gate voltage line VTG1, and the other end of the transfer gate transistor MN11 may be connected to the node N2. One end of the transfer gate transistor MN12 may be connected to the transfer gate voltage line VTG2, and the other end of the transfer gate transistor MN12 may be connected to the node N2.

One end of the isolation transistor MN10 may be connected to the isolation voltage line VISO, and the other end of the isolation transistor MN10 may be connected to the node N2. In this way, the transfer gate transistors MN11 and MN12 and the isolation transistor MN10 may use the node N2 as a common node. As a result, any one voltage among the transfer gate voltage VTG1, the transfer gate voltage VTG2, and the isolation voltage VISO may be provided to the node N2, and the voltage provided to the node N2 may be provided to the gate of the charge transfer transistor MN2 as a signal S2.

The voltage generator 170 may generate a transfer gate voltage VTG1 and provide it to each of one end of the transfer gate transistor MN8 and one end of the transfer gate transistor MN11. Further, the voltage generator 170 may generate a transfer gate voltage VTG2 and provide it to each of one end of the transfer gate transistor MN7 and one end of the transfer gate transistor MN12. An internal circuit configuration of the voltage generator 170 that generates the transfer gate voltage VTG1 and the transfer gate voltage VTG2 will be described below with reference to FIG. 6.

In some embodiments, the memory device 100 may further include a timing generator 190. For example, the timing generator 190 may be included in the control logic 114 of FIG. 1, and may generate and provide control signals CS1 and CS3 to the charge transfer transistor driving circuit 180. The timing generator 190 will be described below with reference to FIGS. 10 to 12.

Next, referring to FIG. 4 and FIG. 5 together, the bit line sense amplifier BLSA may be connected between the bit line BL and the complementary bit line BLB. The bit line sense amplifier BLSA may use a signal that is input from the bit line BL and a signal that is input from the complementary bit line BLB as a differential input signal pair. The bit line sense amplifier BLSA may include a sensing bit line SBL and a sensing complementary bit line SBLB.

The bit line sense amplifier BLSA may include P-type amplification parts MP1 and MP2 whose one ends are connected to a control line LA, and N-type amplification parts MN5 and MN6 whose one ends are connected to a control line LAB. For example, the ends of the P-type amplification parts MP1 and MP2 may be connected to each other, and the ends of N-type amplification parts MN5 and MN6 may be connected to each other. The other ends of each of the P-amplification parts MP1 and MP2 and the N-amplification parts MN5 and MN6 may be electrically connected to the sensing bit line SBL connected to the bit line BL or the sensing complementary bit line SBLB connected to the complementary bit line BLB. The amplification transistor MP1 and the amplification transistor MP2, and the amplification transistor MN5 and the amplification transistor MN6 may be connected to each other in a cross-coupling structure.

For example, the amplification transistor MP1 may be connected between the control line LA and the sensing bit line SBL, and the gate of the amplification transistor MP1 may be connected to the sensing complementary bit line SBLB. The amplification transistor MP2 may be connected between the control line LA and the sensing complementary bit line SBLB, and a gate of the amplification transistor MP2 may be connected to the sensing bit line SBL. The amplification transistor MN5 may be connected between the control line LAB and the sensing bit line SBL, and the gate of the amplification transistor MN5 may be connected to the sensing complementary bit line SBLB. The amplification transistor MN6 may be connected between the control line LAB and the sensing complementary bit line SBLB, and the gate of the amplification transistor MN6 may be connected to the sensing bit line SBL.

In some embodiments, the bit line sense amplifier BLSA may include an equalizing transistor MN3 and an equalizing transistor MN4. The equalizing transistor MN3 may be connected between the sensing bit line SBL and node N3, and the equalizing transistor MN4 may be connected between the sensing complementary bit line SBLB and the node N3. When a control signal CS4 is applied to the gates of the equalizing transistor MN3 and the equalizing transistor MN4, the sensing bit line SBL and the sensing complementary bit line SBLB may be electrically connected. Further, when the control signal CS4 is applied to the gates of the equalizing transistor MN3 and the equalizing transistor MN4, the sensing bit line SBL and the sensing complementary bit line SBLB connected electrically may be pre-charged with a pre-charge voltage VBL or may be pre-charged with a pre-charge voltage VPRE. The pre-charge voltages VBL and VPRE may be provided to the equalizing transistors MN3 and MN4 via the node N3. According to some embodiments, the equalizing transistors MN3 and MN4 may be, but are not limited to, N-type transistors. According to embodiments, the equalizing transistors MN3 and MN4 may be implemented as P-type transistors.

The bit line sense amplifier BLSA may include a pre-charge transistor MN13 and a pre-charge transistor MN14. The pre-charge transistor MN13 may be turned on/off in response to a pre-charge equalizing signal PEQ provided to the gate of the pre-charge transistor MN13. For example, if the pre-charge transistor MN13 is implemented as an N-type transistor, it may be turned on when the pre-charge equalizing signal PEQ is logic high. The pre-charge transistor MN13 may pre-charge the bit line BL and the complementary bit line BLB to any one voltage level of a high voltage VH or a low voltage VL. At this time, the high voltage VH and the low voltage VL may each have a voltage level between the power supply voltage VDD and the ground voltage VSS, and the magnitude of the high voltage VH may be greater than the magnitude of the low voltage VL. In other words, the pre-charge voltage VBL may be cither a high voltage VH or a low voltage VL, and the bit line BL and the complementary bit line BLB may be pre-charged equally to any one voltage level of the high voltage VH and the low voltage VL.

The pre-charge transistor MN14 may be turned on/off in response to a pre-charge equalizing signal PEQi provided to the gate of the pre-charge transistor MN14. For example, if the pre-charge transistor MN14 is implemented as an N-type transistor, it may be turned on when the pre-charge equalizing signal PEQi is logic high. The pre-charge transistor MN14 may pre-charge the sensing bit line SBL and the sensing complementary bit line SBLB to any one voltage level of the high voltage VH or the low voltage VL. In other words, the pre-charge voltage VPRE may be any one of the high voltage VH or the low voltage VL, and the sensing bit line SBL and the sensing complementary bit line SBLB may be equally pre-charged to any one voltage level of the high voltage VH and the low voltage VL.

In some embodiments, the bit line BL and the sensing bit line SBL may be pre-charged with different voltages, and the complementary bit line BLB and the sensing complementary bit line SBLB may be pre-charged with different voltages. For example, when the charge transfer transistor MN1 and the charge transfer transistor MN2 are each turned on by the isolation voltage VISO provided to the node N1 and the node N2, and the pre-charge transistor MN13 is turned on in response to the pre-charge equalizing signal PEQ provided to the gates, all of the bit line BL, the sensing bit line SBL, the complementary bit line BLB, and the sensing complementary bit line SBLB may be pre-charged with the pre-charge voltage VBL.

Thereafter, the charge transfer transistor MN1 and the charge transfer transistor MN2 are turned off, the pre-charge transistor MN14 is turned on in response to the pre-charge equalizing signal PEQi provided to the gate of the pre-charge transistor MN14, and the sensing bit line SBL and the sensing complementary bit line SBLB may be pre-charged with the pre-charge voltage VPRE.

At this time, the pre-charge voltage VBL and the pre-charge voltage VPRE may have different voltage levels from each other. In other words, by turning off both the charge transfer transistors MN1 and MN2, the bit line BL, the sensing bit line SBL, the complementary bit line BLB and the sensing complementary bit line SBLB may be pre-charged with different voltages. For example, when the bit line BL and the complementary bit line BLB are pre-charged with the pre-charge voltage VBL corresponding to the low voltage VL, the sensing bit line SBL and the sensing complementary bit line SBLB may be pre-charged with the pre-charge voltage VPRE corresponding to the high voltage VH. Conversely, when the bit line BL and the complementary bit line BLB are pre-charged with the pre-charge voltage VBL corresponding to the high voltage VH, the sensing bit line SBL and the sensing complementary bit line SBLB may be pre-charged with the pre-charge voltage VPRE corresponding to the low voltage VL.

In some embodiments, when the pre-charge voltage VBL is a low voltage VL and the pre-charge voltage VPRE is a high voltage VH, each of the charge transfer transistor MN1 and the charge transfer transistor MN2 may be implemented as a N-type transistor. As another embodiment, when the pre-charge voltage VBL is a high voltage VH and the pre-charge voltage VPRE is a low voltage VL, each of the charge transfer transistor MN1 and the charge transfer transistor MN2 may be implemented as a P-type transistor.

In some embodiments, one end of the charge transfer transistor MN1 may be connected to the bit line BL, and the other end of the charge transfer transistor MN1 may be connected to the sensing bit line SBL. The charge transfer transistor MN1 may connect the bit line BL and the sensing bit line SBL according to a signal applied to the gate of the charge transfer transistor MN1. For example, when the isolation voltage VISO is applied to the gate of the charge transfer transistor MN1, the charge transfer transistor MN1 is turned on, and the bit line BL and the sensing bit line SBL may be connected to each other. Alternatively, when the transfer gate voltage VTG1 or the transfer gate voltage VTG2 is applied to the gate of the charge transfer transistor MN1, the charge transfer transistor MN1 may amplify the electric charge that is transmitted from the sensing bit line SBL to the bit line BL. When the ground voltage VSS is applied to the gate of the charge transfer transistor MN1, the charge transfer transistor MN1 is turned off, and the bit line BL and the sensing bit line SBL may not be connected to each other.

One end of the charge transfer transistor MN2 may be connected to the complementary bit line BLB, and the other end of the charge transfer transistor MN2 may be connected to the sensing complementary bit line SBLB. The charge transfer transistor MN2 may connect the complementary bit line BLB and the sensing complementary bit line SBLB according to a signal applied to the gate of the charge transfer transistor MN2. For example, when the isolation voltage VISO is applied to the gate of the charge transfer transistor MN2, the charge transfer transistor MN2 is turned on, and the complementary bit line BLB and the sensing complementary bit line SBLB may be connected to each other. When the transfer gate voltage VTG1 or the transfer gate voltage VTG2 is applied to the gate of the charge transfer transistor MN2, the charge transfer transistor MN2 may amplify the electric charge transmitted from the sensing complementary bit line SBLB to the complementary bit line BLB. When the ground voltage VSS is applied to the gate of the charge transfer transistor MN2, the charge transfer transistor MN2 is turned off, and the complementary bit line BLB and the sensing complementary bit line SBLB may not be connected to each other.

As shown in FIG. 5, in the charge transfer transistor driving circuit 180, the transistors MN7, MN8 and MN9 that provide the signal S1 to the gate of the charge transfer transistor MN1, and the transistors MN10, MN11 and MN 12 that provide the signal S2 to the gate of the charge transfer transistor MN2 may be implemented to be separate from each other. For example, the transfer gate transistors MN7 and MN8 and the isolation transistor MN9 may provide the signal S1 to the node N1 connected to the gate of the charge transfer transistor MN1, and the transfer gate transistors MN11 and MN12 and the isolation transistor MN10 may provide the signal S2 to the node N2 connected to the gate of the charge transfer transistor MN2.

The charge transfer transistor MN1 and the charge transfer transistor MN2 may be turned on simultaneously. For example, the isolation transistors MN9 and MN10 may be gated and turned on by the same control signal CS2, and therefore, the isolation voltage VISO may be provided to each gate of the charge transfer transistors MN1 and MN2 to turn them on.

Since the driving circuit that provides the signal S1 to the gate of the charge transfer transistor MN1 is separated from the driving circuit that provides the signal S2 to the gate of the charge transfer transistor MN2, when the charge transfer transistor MN1 outputs the signal of the sensing bit line SBL to the bit line BL, and the charge transfer transistor MN2 outputs the signal of the sensing complementary bit line SBLB to the complementary bit line BLB, voltages of different magnitudes may be applied to the gates of the charge transfer transistor MN1 and the charge transfer transistor MN2.

For example, the transfer gate transistor MN7 and the transfer gate transistor MN11 may each be gated by the control signal CS1, and the transfer gate voltage MN8 and the transfer gate voltage MN12 may each be gated by the control signal CS3. Furthermore, the magnitude of the transfer gate voltage VTG1 and the magnitude of the transfer gate voltage VTG2 may be set to be different from each other. Accordingly, the transfer gate voltage VTG1 or the transfer gate voltage VTG2 of different magnitudes from each other may be applied to the gates of the charge transfer transistor MN1 and the charge transfer transistor MN2.

In this way, when both the bit line BL and the bit line BLB are pre-charged with the same low voltage VL or the same high voltage VH, the magnitudes of the transfer gate voltage applied to each gate of the charge transfer transistor MN1 and the charge transfer transistor MN2 at the time of the charge transfer operation of the bit line sense amplifier BLSA are set to be different from each other, and the current driving capabilities of the charge transfer transistor MN1 and the charge transfer transistor MN2 may be set to be different from each other. Accordingly, the ability of the bit line sense amplifier BLSA to sense data 0 or data 1 stored in the memory cell MC may be improved. The operation of the bit line sense amplifier BLSA will be described below with reference to FIG. 14 or the like.

Figure 6:
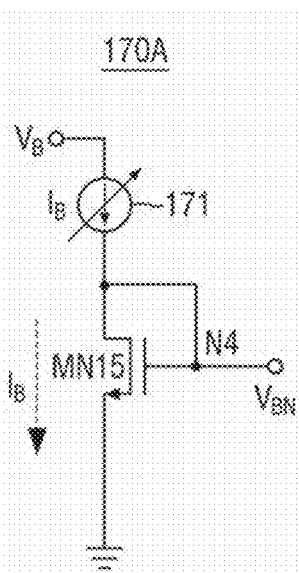
FIG. 6 is a circuit diagram of a voltage generator of FIG. 4.

FIG. 6 is a circuit diagram of a voltage generator according to some embodiments.

FIG. 6 is a diagram showing a circuit of a bias voltage generator 170A that generates the transfer gate voltage VTG1 and/or the transfer gate voltage VTG2 when the charge transfer transistors MN1 and MN2 of FIGS. 4 and 5 are implemented as N-type transistors.

Referring to FIG. 6, a drain of the transistor MN15 may be connected to a current source 171, and a source of transistor MN15 may be grounded. The gate of the transistor MN15 may be connected to the drain of the transistor MN15. A current source 171 connected to the drain of the transistor MN15 may generate a variable current $I_B$ that is variable depending on temperature.

A voltage $V_{BN}$ provided by the node N4 connected to the gate of the transistor MN15 may be a transfer gate voltage VTG1 and/or a transfer gate voltage VTG2. In some embodiments, both the transfer gate voltage VTG1 and the transfer gate voltage VTG2 having different voltage levels may be generated, using the voltage generator 170A of FIG. 4. Alternatively, according to an embodiment, either the transfer gate voltage VTG1 or the transfer gate voltage VTG2 is generated using the voltage generator 170A of FIG. 4, and a voltage having a difference from the generated transfer gate voltage by a predetermined voltage level may be generated and set to the other of the transfer gate voltage VTG1 and the transfer gate voltage VTG2.

Figure 7:
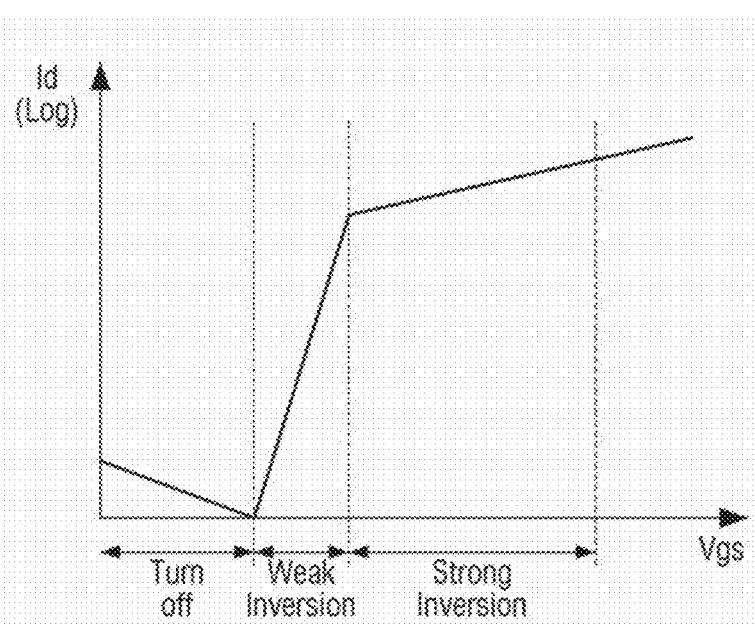
FIGS. 7 and 8 are diagrams for explaining the operation of the voltage generator of FIG. 6.
Figure 8:
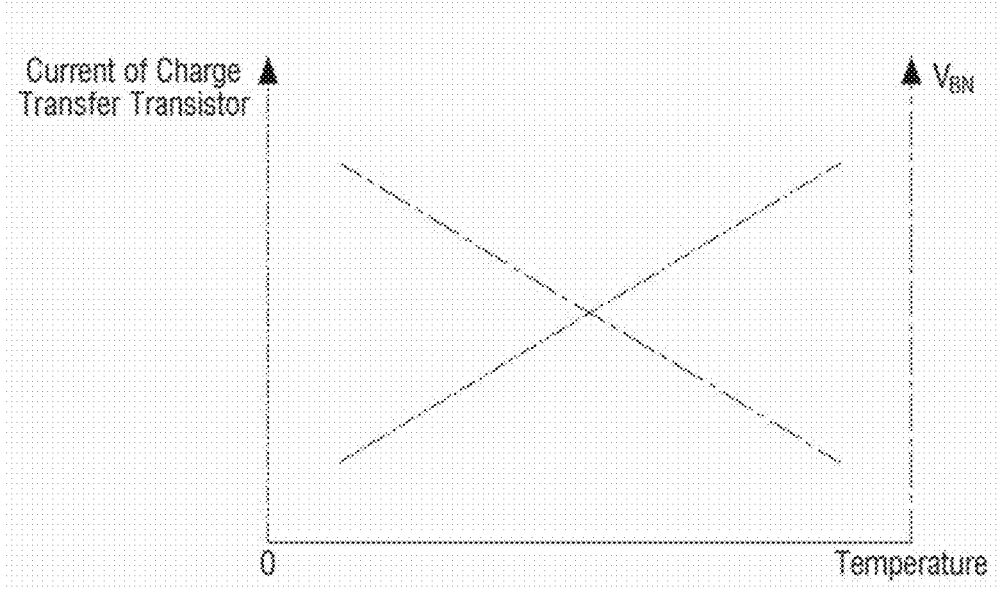

FIGS. 7 and 8 are diagrams for explaining the operation of the voltage generator of FIG. 6. Although the charge transfer transistor MN1 will be explained below as an example, the same explanation is also applicable to the charge transfer transistor MN2.

Referring first to FIG. 7, the graph of FIG. 7 shows a drain current Id to a gate-source voltage Vgs of the charge transfer transistor MN1 on a logarithmic scale.

When a magnitude of the gate-source voltage Vgs of the charge transfer transistor MN1 is larger than a magnitude of a threshold voltage Vth of the charge transfer transistor MN1 and the charge transfer transistor MN1 is in a strong inversion state, since a magnitude of a slope of the drain current Id to the gate-source voltage Vgs is relatively small compared to a case where the charge transfer transistor MN1 is in a weak inversion state, the gain of charge transfer transistor MN1 may be relatively small.

As a result, at the time of the charge transfer operation of the bit line sense amplifier BLSA, it is required to set the magnitude of the gate-source voltage Vgs of the charge transfer transistor MN1 to approximately the magnitude of the threshold voltage Vth of the charge transfer transistor MN1, and to set the charge transfer transistor MN1 to operate in a weak inversion state, such that a sufficient gain of the charge transfer transistor MN1 may be ensured.

For example, according to the embodiment, when the transfer gate voltage VTG1 or the transfer gate voltage VTG2 is applied to the gate of the charge transfer transistor MN1 during the charge transfer operation of the bit line sense amplifier BLSA, it is necessary to set the magnitude of the transfer gate voltage VTG1 or VTG2 to be approximately equal to the magnitude of the threshold voltage Vth of the charge transfer transistor MN1. This ensures that the charge transfer transistor MN1 achieves sufficient gain.

However, when the charge transfer transistor MN1 is in a weak inversion state at the time of the charge transfer operation of the bit line sense amplifier BLSA, the current of the charge transfer transistor MN1 may be variable depending on temperature. For example, referring to FIG. 8, as the temperature is high, the amount of current flowing through the charge transfer transistor MN1 may be large during the charge transfer operation of the bit line sense amplifier BLSA, and as the temperature is low, the amount of current flowing through the charge transfer transistor MN1 may be small during the charge transfer operation of the bit line sense amplifier BLSA.

In this way, when the current flowing through the charge transfer transistor MN1 varies with temperature during the charge transfer operation of the bit line sense amplifier BLSA, the gain value of the charge transfer transistor MN1 also changes with the temperature. Consequently, temperature conditions may become a factor influencing the current drive capability of the charge transfer transistor MN1, in addition to the magnitude of the transfer gate voltage applied to the gate of charge transfer transistor MN1. Therefore, when generating the transfer gate voltage VTG1 or the transfer gate voltage VTG2 applied to the gate of the charge transfer transistor MN1 at the time of the charge transfer operation of the bit line sense amplifier BLSA, the amount of current flowing through the charge transfer transistor MN1 needs to be set irrespective of the temperature conditions.

Referring to FIG. 8, the magnitude of the voltage $V_{BN}$ generated by the voltage generator 170A of FIG. 6 may have a value that is inversely proportional to the temperature. In other words, when generating the transfer gate voltage VTG1 or the transfer gate voltage VTG2 that is applied to the gate of the charge transfer transistor MN1 using the voltage generator 170A of FIG. 6, as the temperature of the charge transfer transistor MN1 is high, the magnitude of the generated transfer gate voltage VTG1 or VTG2 may decrease, and as the temperature of the charge transfer transistor MN1 may be low, the magnitude of the generated transfer gate voltage VTG1 or VTG2 may be large.

In this way, when the voltage $V_{BN}$, which is inversely proportional to temperature, is applied to the gate of the charge transfer transistor MN1, it is canceled out by the current of the charge transfer transistor MN1, which is proportional to temperature. As a result, the amount of current flowing through the charge transfer transistor MN1 may be constant regardless of temperature variations at the time of the charge transfer operation of the bit line sense amplifier BLSA.

Therefore, when generating the transfer gate voltage VTG1 and/or transfer gate voltage VTG2 to be applied to each of the gates of the charge transfer transistor MN1 and the charge transfer transistor MN2 by a complementary to absolute temperature (CTAT) voltage generator as in FIG. 6, at the time of the charge transfer operation of the bit line sense amplifier BLSA, the current flowing through the charge transfer transistor MN1 and MN2 is set irrespective of the temperature, and the gain values of the charge transfer transistor MN1 and MN2 may be set to be constant depending on the temperature.

Figure 9:
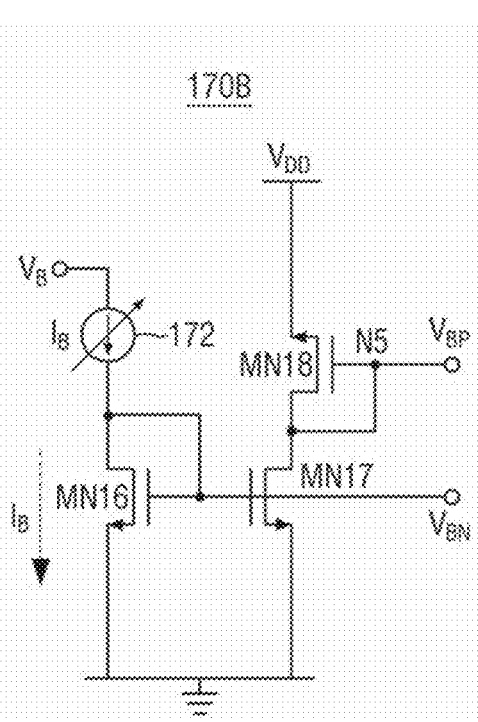
FIG. 9 is a circuit diagram of a voltage generator according to some other embodiments.

FIG. 9 is a circuit diagram of a voltage generator according to some other embodiments.

FIG. 9 is a diagram showing a circuit of a bias voltage generator 170B that generates the transfer gate voltage VTG1 and/or the transfer gate voltage VTG2 when the charge transfer transistors MN1 and MN2 of FIGS. 4 and 5 are implemented as P-type transistors.

Referring to FIG. 9, the drain of transistor MN16 may be connected to the current source 172, and the source of the transistor MN16 may be grounded. The gate of the transistor MN16 may be connected to the drain of the transistor MN16. The current source 172 connected to the drain of the transistor MN16 may generate a current $I_B$ that is variable depending on temperature.

The gate of the transistor MN16 may be connected to the gate of transistor MN17. The source of the transistor MN17 may be grounded, and the drain of the transistor MN17 may be connected to the drain of transistor MN18. The source of the transistor MN18 may be connected to the power supply voltage $V_{DD}$, and the gate of the transistor MN18 and the drain of the transistor MN18 may be connected to each other. The voltage $V_{BP}$ provided by node N5 connected to the gate of the transistor MN18 may be the transfer gate voltage VTG1 and/or the transfer gate voltage VTG2. In some embodiments, the transfer gate voltage VTG1 and the transfer gate voltage VTG2 having different voltage levels may be generated, using the voltage generator 170B of FIG. 9. Alternatively, according to an embodiment, either the transfer gate voltage VTG1 or VTG2 is generated using the voltage generator 170B of FIG. 9, and a voltage having a difference from the generated transfer gate voltage by a predetermined voltage level may be generated and set to the other of the transfer gate voltage VTG1 and VTG2.

Figure 10:
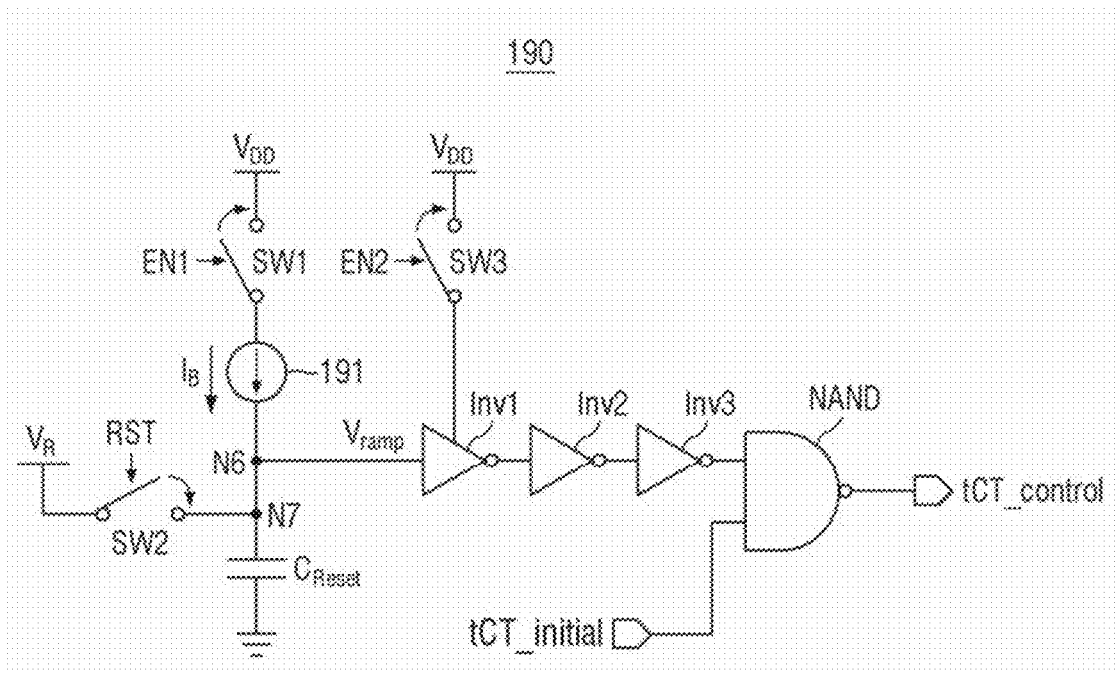
FIG. 10 is a circuit diagram of a timing generator according to some embodiments.

FIG. 10 is a circuit diagram of a timing generator according to some embodiments.

Referring to FIG. 10, a current source 191 and an inverter Inv1 may be connected to node N6. The current source 191 may be connected to switch SW1, and when enable signal EN1 is applied to the switch SW1, the switch SW1 is turned on and the power supply voltage $V_{DD}$ may be provided to the node N6. According to this embodiment, the current source 191 is implemented as a variable current source and may generate a current $I_B$ that is variable depending on temperature. Alternatively, the current source 191 may generate the current $I_B$ that is constant depending on temperature.

A first end of a reset capacitor $C_{Reset}$ may be grounded, and a second end of the reset capacitor $C_{Reset}$ may be connected to the node N6. The node N7 may be connected to switch SW2, and when a reset signal RST is applied to the switch SW2, the switch SW2 is turned on, and a reset voltage $V_R$ may be provided to the node N7.

The inverter Inv1 may be connected to switch SW3. When enable signal EN2 is applied to the switch SW3, the switch SW3 is turned on, and the power supply voltage $V_{DD}$ may be provided to the inverter Inv1, and the inverter Inv1 may perform an inverting operation on an input signal $V_{ramp}$. An input terminal of the inverter Inv1 may be connected to node N6, and an output terminal of the inverter Inv1 may be connected to the input terminal of inverter Inv2. The output terminal of the inverter Inv2 may be connected to the input terminal of inverter Inv3, and the signal that is output from the inverter Inv3 may be input to NAND gate NAND. Furthermore, a signal tCT_initial may be input to the NAND gate NAND. The NAND gate NAND may output a signal tCT_control on the basis of the input signals to the NAND gate NAND.

The signal tCT_control finally generated by the timing generator 190 may correspond to the control signal CS1 or the control signal CS3 of FIG. 4. The signal tCT_control may adjust a time width at which the transfer gate voltage VTG1 or the transfer gate voltage VTG2 is applied to the charge transfer transistor MN1 during the charge transfer operation of the bit line sense amplifier BLSA. Similarly, the signal tCT_control may adjust the time width at which the transfer gate voltage VTG1 or the transfer gate voltage VTG2 is applied to the charge transfer transistor MN2 during the charge transfer operation of the bit line sense amplifier BLSA.

For example, when the charge transfer transistors MN1 and MN2 are implemented as N-type transistors, and the time in which the signal tCT_control has the logic high state is large, the amount of charge transferred by each of the charge transfer transistors MN1 and MN2 may be large during the charge transfer operation of the bit line sense amplifier BLSA.

Figure 11:
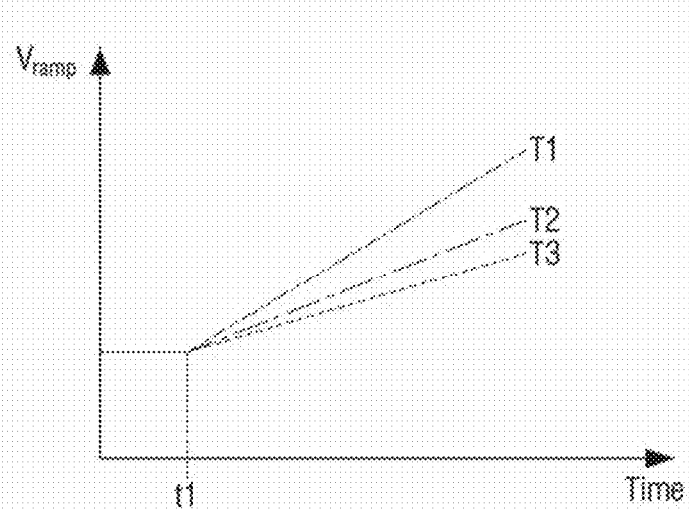
FIGS. 11 and 12 are diagrams for explaining the operation of the timing generator of FIG. 10.
Figure 12:
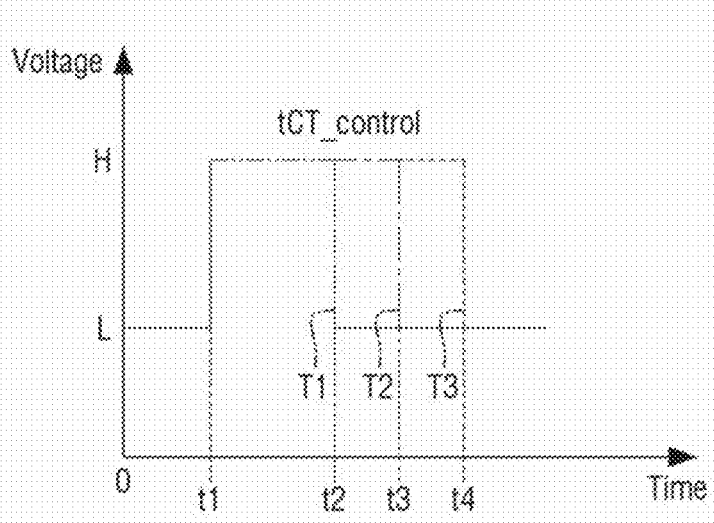

FIGS. 11 and 12 are diagrams for explaining the operation of the timing generator of FIG. 10.

First, referring to FIGS. 10 and 11, when the enable signal EN1 is applied to the switch SW1, the switch SW1 is turned on, and the current $I_B$ flows through the node N6, the charge may be stored in the reset capacitor $C_{Reset}$. At this time, when the reset signal RST is applied to the switch SW2 at time t1 and the switch SW2 is turned on, the reset voltage $V_R$ may be applied to the node N7. As a result, the voltage $V_{ramp}$ of the node N6 gradually increases over time.

At this time, the current $I_B$ may be a proportional to absolute temperature (PTAT) current. In other words, the magnitude of the voltage $V_{ramp}$ of the node N6 may increase as the temperature increases (temperature T1>temperature T2>temperature T3).

Similarly, as described above with reference to FIG. 7, when the charge transfer transistor MN1 is in the weak inversion state, as the temperature is high, the amount of current flowing through the charge transfer transistor MN1 may be large during the charge transfer operation of the bit line sense amplifier BLSA. Therefore, the gain value of the charge transfer transistor MN1 may vary depending on the temperature.

Thereafter, when the enable signal EN2 is applied to the switch SW3, the switch SW3 is turned on and the power supply voltage $V_{DD}$ may be supplied to the inverter Inv1. The inverter Inv1 may receive the voltage $V_{ramp}$ as an input to perform an inverting operation, and the output signal may be input to the inverter Inv2. In this way, when the signal finally output through the inverter Inv2 and the inverter Inv3 and the signal tCT_initial are input to the NAND gate NAND, the signal tCT_control may be finally generated.

Next, referring to FIG. 12, the time at which the signal tCT_control generated using the timing generator 190 has a logic high state may vary depending on temperature. In other words, as the temperature is high, the time at which the signal tCT_control is maintained at a logic high state may be small, and as the temperature is low, the time at which the signal tCT_control is maintained at a logic high state may be large.

For example, when the temperatures are T1, T2, and T3, respectively, each signal tCT_control generated using the timing generator 190 of FIG. 10 may transition from a logic low L to a logic high H at time t1. Thereafter, the signal tCT_control generated when the temperature is T1 may transition to the logic low L at time t2, the signal tCT_control which is generated when the temperature is T2 lower than T1 may transition to the logic low L at time t3 after time t2, and the signal tCT_control generated at t3 when the temperature is lower than T2 may transition to the logic low L at time t4 after time t3.

In this way, in some embodiments, even if the drive currents of the charge transfer transistors MN1 and MN2 vary with temperature during the charge transfer operation of the bit line sense amplifier BLSA, the time at which the transfer gate voltage is applied to each gate of the charge transfer transistors MN1 and MN2 at a high temperature is adjusted to be shorter, and the time at which the transfer gate voltage is applied to each gate of the charge transfer transistors MN1 and MN2 at a lower temperature is adjusted to be longer. Accordingly, the gate values of the charge transfer transistors MN1 and MN2 may be kept constant depending on temperature.

FIGS. 13 to 22 are diagrams for explaining a method of driving a sensing device according to some embodiments. Hereinafter, in FIGS. 13 to 22, a case in which the bit line BL and the complementary bit line BLB are pre-charged with the low voltage VL, and the charge transfer transistor MN1 and the charge transfer transistor MN2 are implemented as N-type transistors will be explained as an example.

Figure 13:
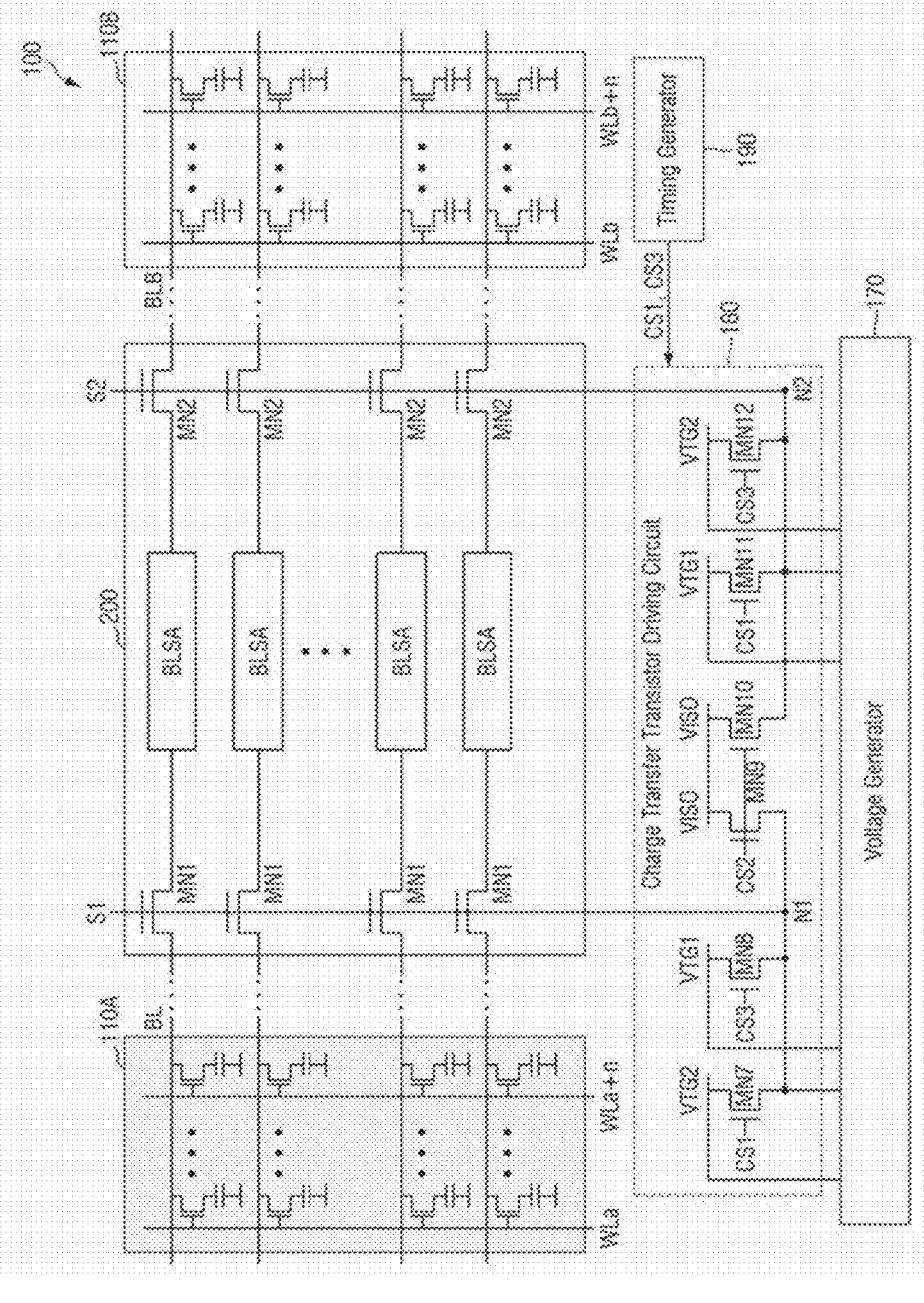
FIGS. 13, 14, 15, 16, 17, 18, 19, 20, 21 and 22 are diagrams for explaining a method of driving a sensing device according to some embodiments.
Figure 14:
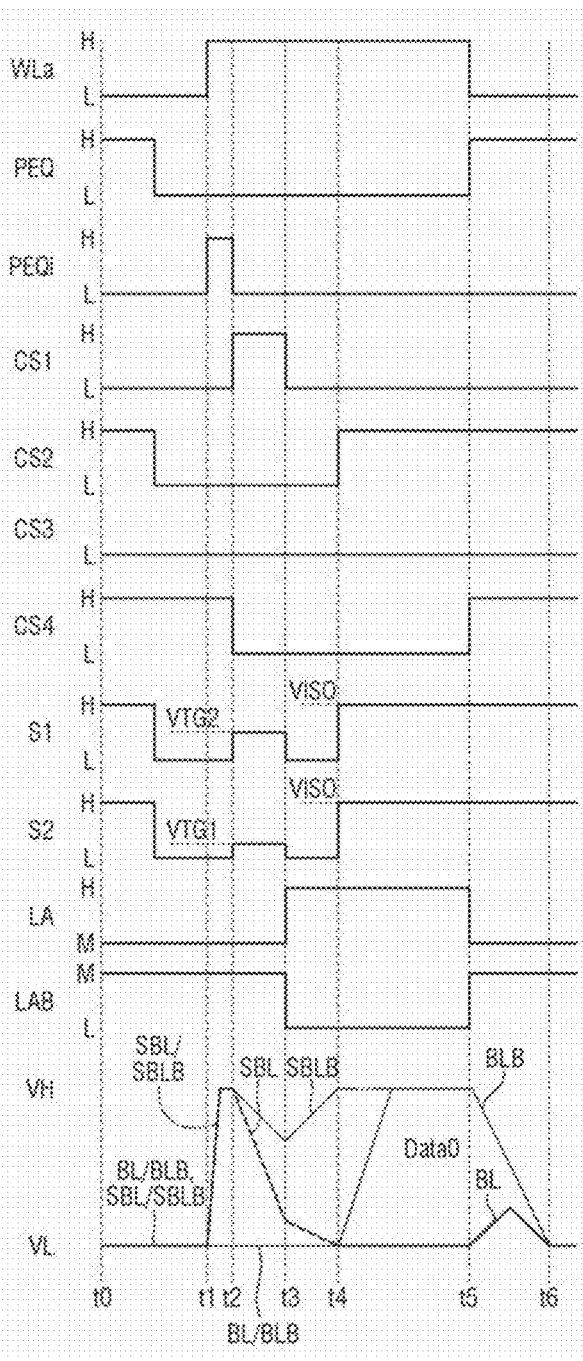

First, an operation in which the memory cell array 110A of FIG. 13 is activated and the sensing device 200 senses data 0 stored in the memory cells of the memory cell array 110A will be described with reference to FIGS. 13 to 20. FIG. 14 is a timing diagram showing the operation of the bit line sense amplifier BLSA according to some embodiments. The bit line sense amplifier BLSA may sequentially perform a pre-charge operation, a charge sharing operation, a charge transfer operation, a sensing operation, and a restore operation.

Figure 15:
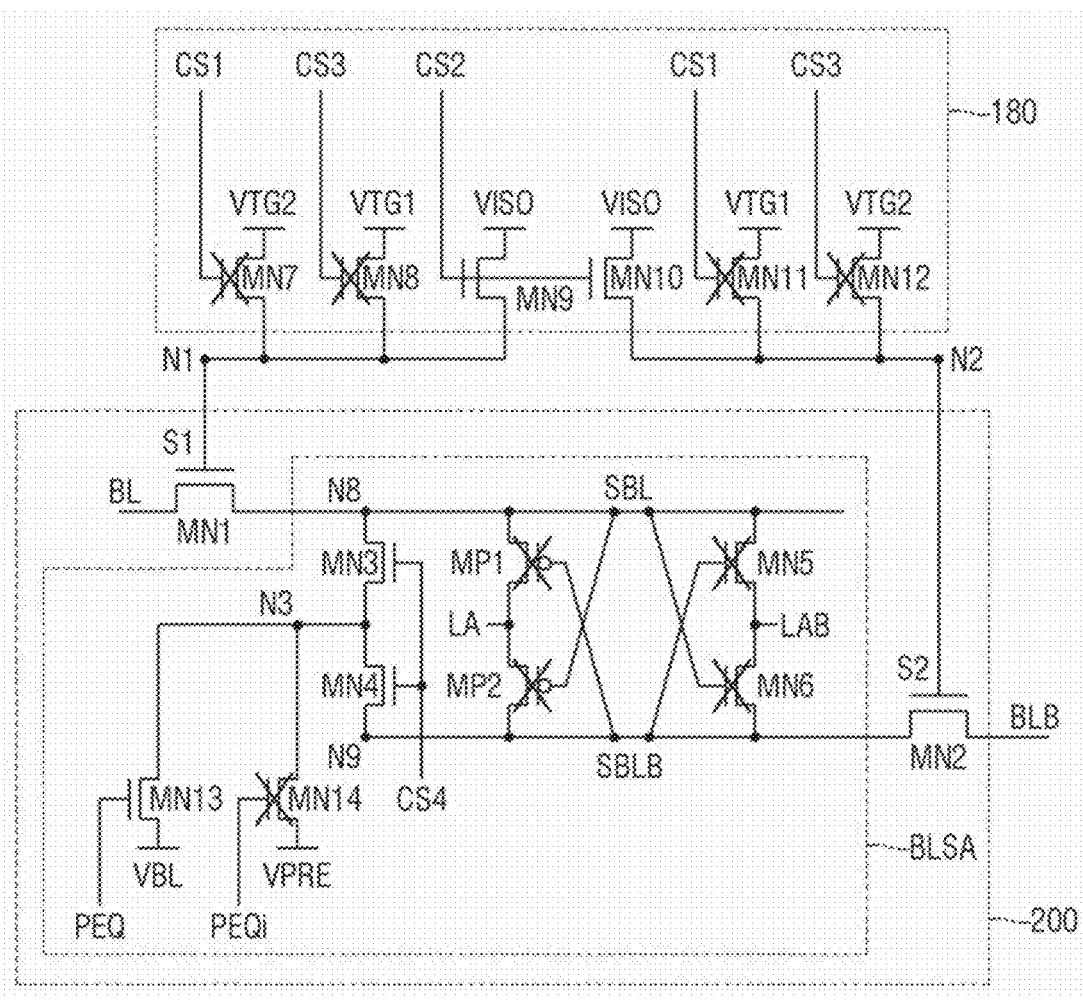

Referring to FIGS. 14 and 15, the bit line sense amplifier BLSA may first perform a pre-charge operation at interval (t0 to t1). The pre-charge equalizing signal PEQ is applied to the gate of the pre-charge transistor MN13 at logic high, and the pre-charge transistor MN13 may be turned on to provide the pre-charge voltage VBL through the node N3. At this time, the control signal CS4 is applied to each gate of the equalizing transistors MN3 and MN4 at logic high, and the equalizing transistors MN3 and MN4 may be turned on to pre-charge the sensing bit line SBL and the sensing complementary bit line SBLB with the pre-charge voltage VBL corresponding to the low voltage VL through nodes N8 and N9, respectively.

In addition, the control signal CS2 is applied to each gate of the isolation transistors MN9 and MN10 at logic high, and the isolation transistors MN9 and MN10 may be turned on to provide the isolation voltage VISO to the nodes N1 and N2, respectively. The respective isolation voltages VISO of the nodes N1 and N2 may turn on the charge transfer transistor MN1 and the charge transfer transistor MN2 to connect the sensing bit line SBL and the bit line BL, and connect the sensing complementary bit line SBLB and the complementary bit line BLB. As a result, the bit line BL, the sensing bit line SBL, the complementary bit line BLB, and the sensing complementary bit line SBLB may be constantly pre-charged with the pre-charge voltage VBL corresponding to the low voltage VL.

Figure 16:
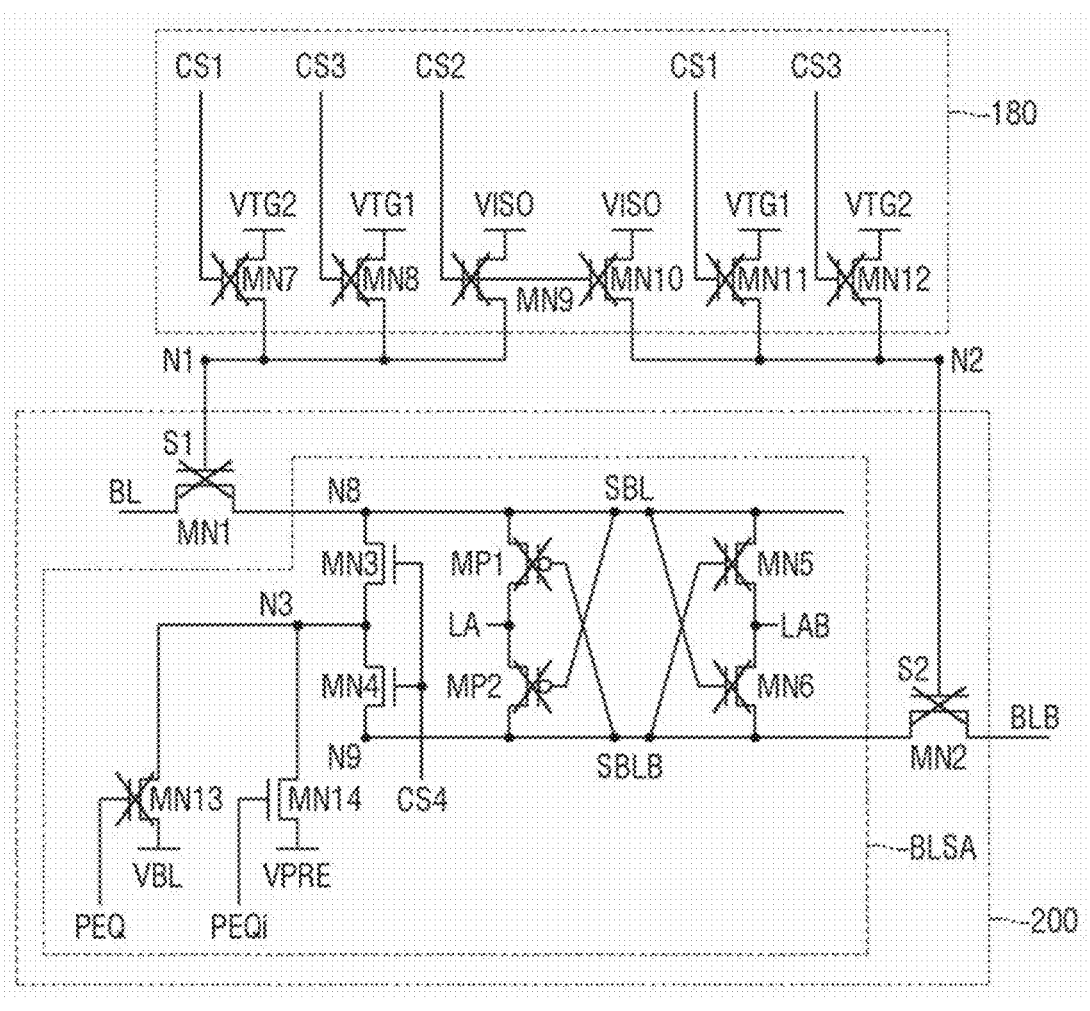

Thereafter, the bit line sense amplifier BLSA may perform the charge sharing operation at the interval (t1 to t3). Referring to FIGS. 13, 14, and 16, the memory cell array 110A may be activated. For example, when the address buffer 120 transmits the row address RA to the row decoder 130 in FIG. 1, the row decoder 130 decodes the row address RA received from the address buffer 120, and may activate any one of the word lines WLa to WLa+n connected to the memory cell array 110A corresponding to the row address RA. Hereinafter, a case where the word line WLa is activated will be described as an example.

At time t1, the voltage supplied to the word line WLa may transition from a low level L to a high level H. As a result, the word line WLa is activated, and the memory cell MC connected to the word line WLa may be selected. However, at this time, charge sharing barely occurs between the charge stored in the cell capacitor of the memory cell MC connected to the word line WLa and the charge stored in the bit line BL. For example, since the bit line BL is pre-charged with the low voltage VL (e.g., the ground voltage VSS) at the interval (t0 to t1), when data 0 is stored in the cell capacitor, there is no potential difference between the cell capacitor and the bit line BL, and thus, the charge sharing operation may barely occur.

On the other hand, at time t1, the pre-charge equalizing signal PEQi transitions from the logic low L to the logic high H, and may be applied to the gate of the pre-charge transistor MN14. Accordingly, the pre-charge transistor MN14 may be turned on to provide the pre-charge voltage VPRE through the node N3. At this time, the pre-charge voltage VPRE may correspond to the high voltage VH (e.g., the power supply voltage VDD), contrary to the pre-charge voltage VBL corresponding to the low voltage VL.

The pre-charge equalizing signal PEQ transitions from the logic high H to the logic low L during the interval (t0 to t1), and may not provide the pre-charge voltage VBL to the node N3 at time t1. At this time, the control signal CS4 is still in the logic high state, and the equalizing transistors MN3 and MN4 may maintain the turned-on state, and pre-charge the sensing bit line SBL and the sensing complementary bit line SBLB with the high voltage VH corresponding pre-charge voltage VPRE through the nodes N8 and N9, respectively.

Further, the control signal CS2 transitions from the logic high H to the logic low L during the interval (t0 to t1), and the charge transfer transistor MN1 and the charge transfer transistor MN2 may be in the turned-off state at time t1. As a result, during the interval (t1 to t2), the bit line BL and the complementary bit line BLB may maintain a pre-charged state with the low voltage VL, and the sensing bit line SBL and the sensing complementary bit line SBLB may be pre-charged with the high voltage VH.

Figure 17:
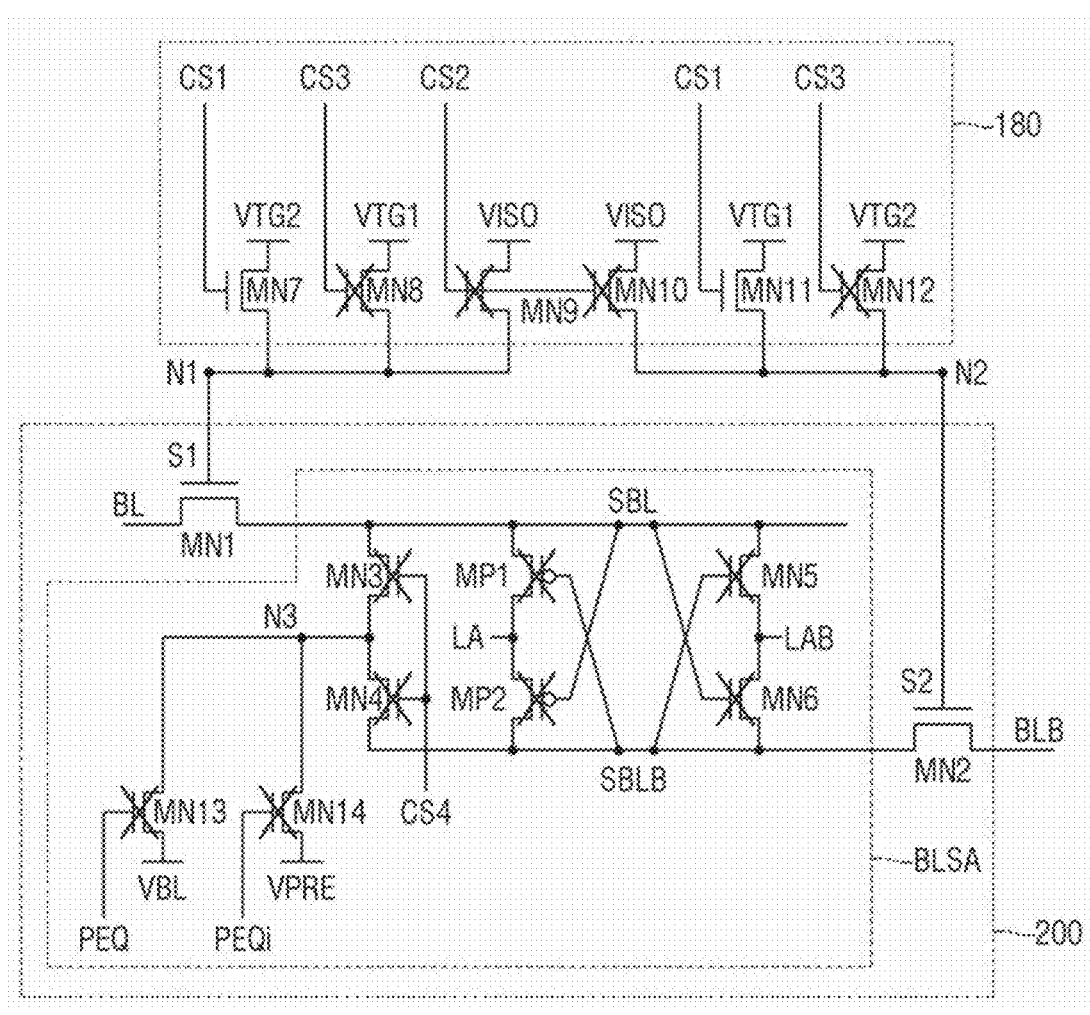

Next, referring to FIGS. 14 and 17, the bit line sense amplifier BLSA may perform a charge transfer operation at the interval (t2 to t3). At time t2, the pre-charge equalizing signal PEQi transitions from the logic high H to the logic low L, the pre-charge transistor MN14 may be turned off, and the pre-charge voltage VPRE may not be provided to the node N3, accordingly. Further, at time t2, the control signal CS1 transitions from the logic low L to the logic high H, and the transfer gate transistor MN7 and the transfer gate transistor MN11 may be turned on, respectively.

According to connection of the transistors in the interval (t2 to t3), the transfer gate voltage VTG2 is provided to the node N1 through the transfer gate transistor MN7, the charge transfer transistor MN1 is turned on weakly depending on the voltage level of the node N1, and the charge stored in the sensing bit line SBL may be output to the bit line BL through the charge transfer transistor MN1. Further, the transfer gate voltage VTG1 is provided to the node N2 through the transfer gate transistor MN11, the charge transfer transistor MN2 is weakly turned on depending on the voltage level of the node N2, and the charge stored on the sensing complementary bit line SBLB may be output to the complementary bit line BLB through the charge transfer transistor MN2.

At this time, since the control signal LA and the control signal LAB have a predetermined intermediate level M voltage, the P-type amplification part (MP1, MP2 of FIG. 5) and the N-type amplification part (MN5, MN6 of FIG. 5) do not amplify the amount of charge stored in the sensing bit line SBL and the sensing complementary bit line SBLB. Rather, the P-type amplification part (MP1, MP2 of FIG. 5) and the N-type amplification part (MN5, MN6 of FIG. 5) may directly output the amount of charge stored in the sensing bit line SBL and the sensing complementary bit line SBLB to the bit line BL and the complementary bit line BLB at time t2.

In some embodiments, the magnitudes of the transfer gate voltage VTG1 and the transfer gate voltage VTG2 may be smaller than the magnitude of the isolation voltage VISO.

In some embodiments, when the bit line BL and the complementary bit line BLB are pre-charged with the low voltage VL, the sensing bit line SBL and the sensing complementary bit line SBLB are pre-charged with the high voltage VH, and the charge transfer transistors MN1 and MN2 are implemented as an N-type transistor, the magnitude of the charge transfer voltage VTG2 applied to the gate of the charge transfer transistor MN1 connected to the activated memory cell array 110A may be greater than the magnitude of the charge transfer voltage VTG1 applied to the gate of the transfer transistor MN2 connected to the non-activated memory cell array 110B. As a result, when the charge transfer operation of the bit line sense amplifier BLSA is performed during the interval (t2 to t3), the potential decrease of the sensing bit line SBL may be greater than the potential decrease of the sensing complementary bit line SBLB.

In other words, as described above, when the bit line BL and the complementary bit line BLB are pre-charged with the low voltage VL, and data 0 stored in the memory cell MC connected to the bit line BL is sensed, there is no sufficient potential difference between the bit line BL and the complementary bit line BLB after the charge sharing operation, and thus, the bit line sense amplifier BLSA may barely sense data 0.

Therefore, in some embodiments, by applying a higher voltage to the gate of the charge transfer transistor MN1 connected to the activated memory cell array 110A during the charge transfer operation, than the voltage applied to the gate of the charge transfer transistor MN2 connected to the non-activated memory cell array 110B, the current driving ability of the charge transfer transistor MN1 may be set to be greater than the current driving ability of the charge transfer transistor MN2 during the charge transfer operation of the bit line sense amplifier BLSA. Accordingly, even if the voltage levels of the bit line BL and the complementary bit line BLB are substantially the same after the charge sharing operation, the sensing bit line SBL may perform a charge transfer operation faster than the complementary sensing bit line SBLB, and thus, a sufficient potential difference may occur between the sensing bit line SBL and the sensing complementary bit line SBLB at time t3. Accordingly, the bit line sense amplifier BLSA may sense the potential difference between the sensing bit line SBL and the sensing complementary bit line SBLB.

Figure 18:
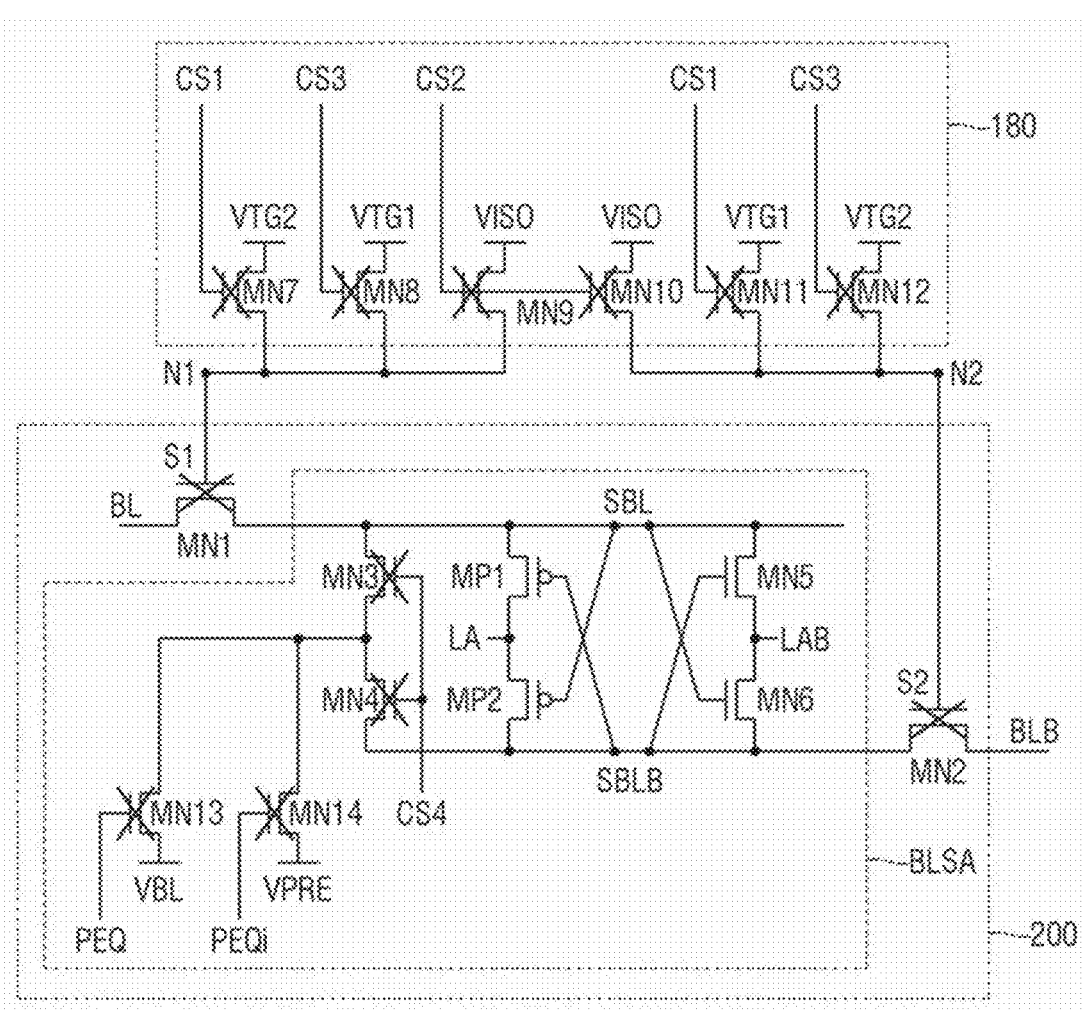

Next, referring to FIGS. 14 and 18, the bit line sense amplifier BLSA may perform the sensing operation at the interval (t3 to t4). At time t3, the control signal CS1 transitions from the logic high H to the logic low L, each of the transfer gate transistor MN7 and the transfer gate transistor MN11 may be turned off, and the charge transfer transistor MN1 and the charge transfer transistor MN2 may be turned off. Furthermore, at time t3, each of the control signal LA and the control signal LAB transitions to the logic high H and the logic low L, the P-type amplification part (MP1, MP2 of FIG. 5) and the N-type amplification part (MN5 and MN6 of FIG. 5) may be activated to amplify the amount of charge stored in the sensing bit line SBL and the sensing complementary bit line SBLB, and the voltage corresponding to the amplified amount of charge may be output to the bit line BL and the complementary bit line BLB.

Figure 19:
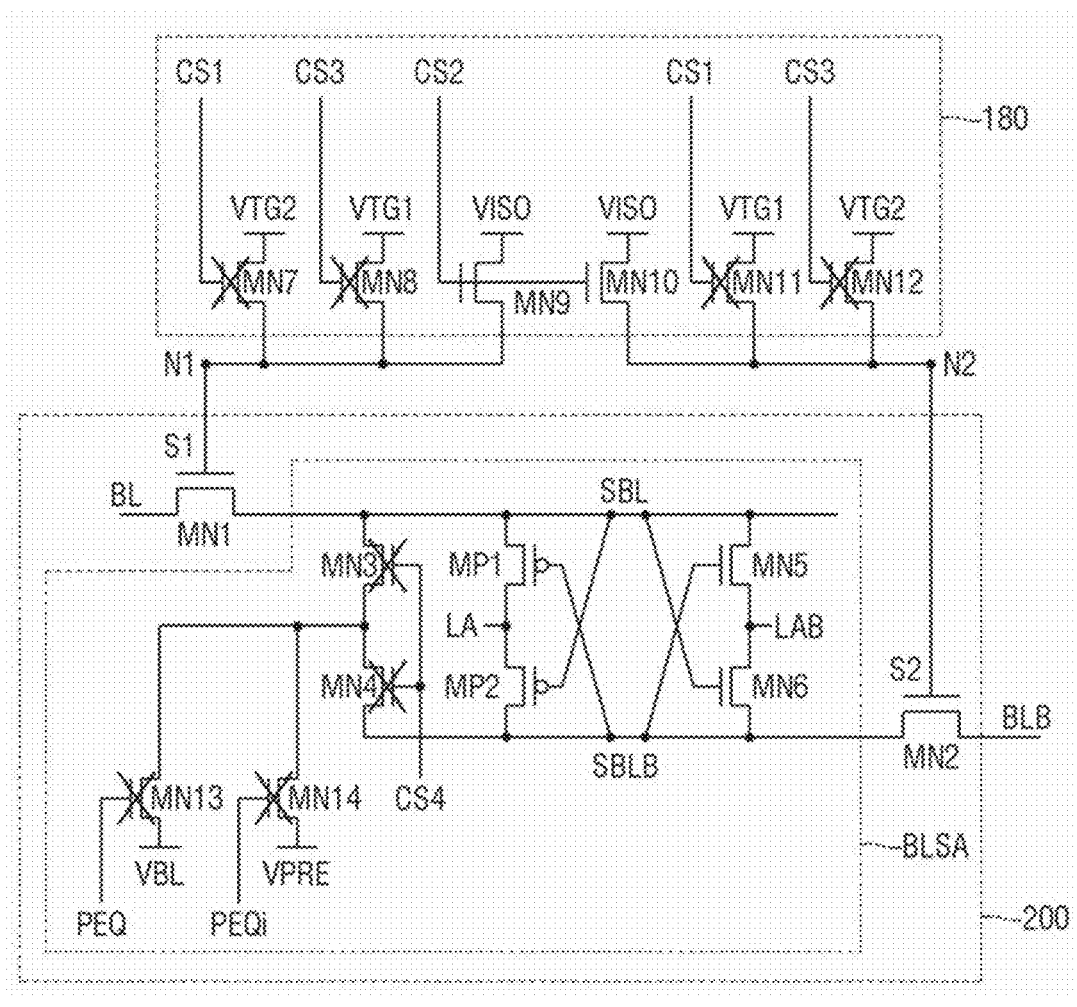

Next, referring to FIGS. 14 and 19, the bit line sense amplifier BLSA may perform a restore operation at the interval (t4 to t5). At time t4, while the control signal CS2 transitions from the logic low L to the logic high H, the isolation transistors MN9 and MN10 may be turned on again, the isolation voltage VISO is provided to each of the nodes N1 and N2, and the charge transfer transistors MN1 and MN2 may be turned on. The control signals LA and LAB are maintained similarly to the interval (t3 to t4), and the P-type amplification part (MP1, MP2 of FIG. 5) and the N-type amplification part (MN5, MN6 of FIG. 5) may perform an amplification operation. Accordingly, the complementary bit line BLB may be sensed to the sensing complementary bit line SBLB by the charge transfer transistor MN2 and charged with the amplified charge, and the bit line BL may maintain the low voltage VL level.

Figure 20:
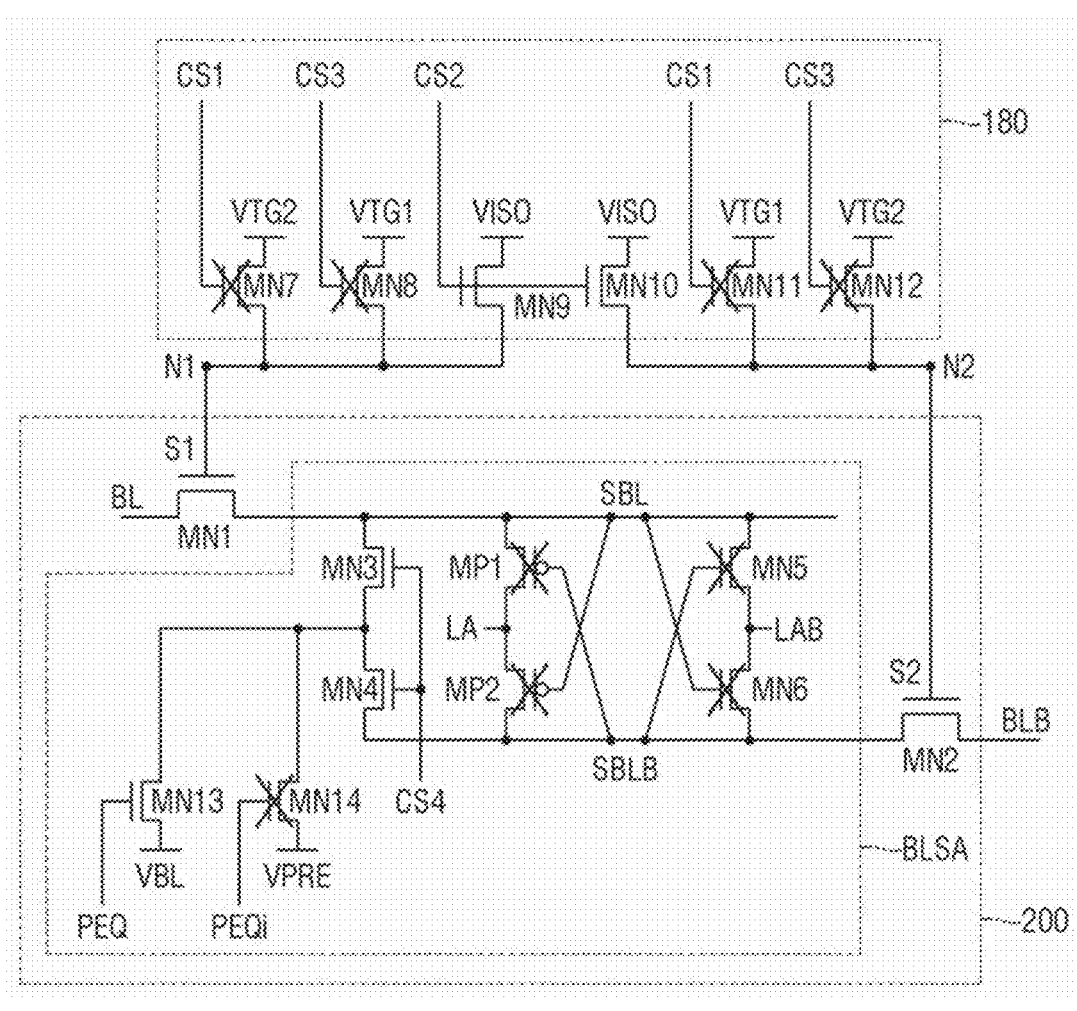

Next, referring to FIGS. 14 and 20, at time t5 of FIG. 9, the pre-charge equalizing signal PEQ transitions from the logic low L to the logic high H, the pre-charge transistor MN13 is turned on, and the pre-charge operation may be performed again at the interval (t5 to t6). Thereafter, the bit line sense amplifier BLSA may sequentially perform a charge sharing operation, a charge transfer operation, a sensing operation, and a restore operation at the interval after t6.

Figure 21:
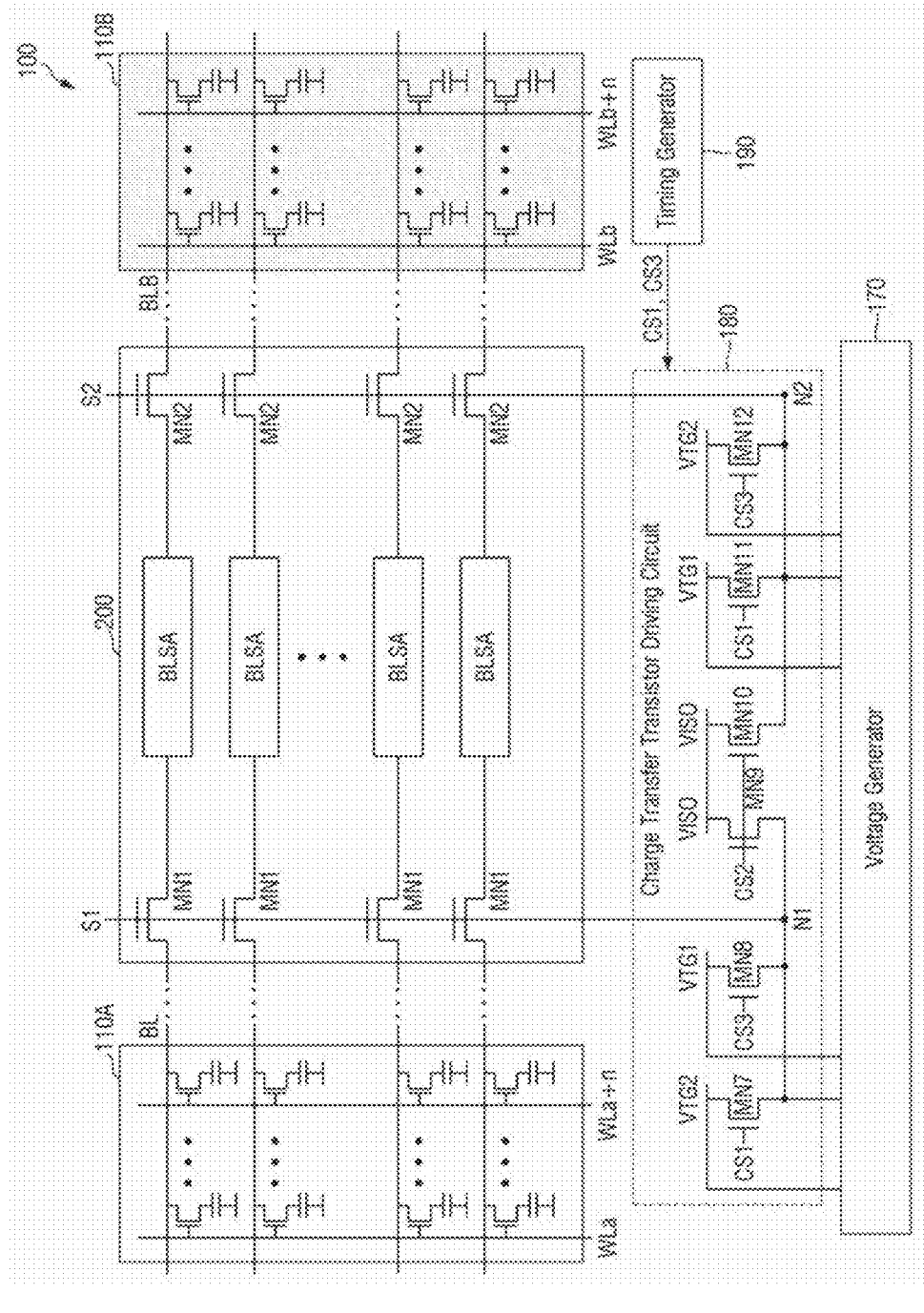
Figure 22:
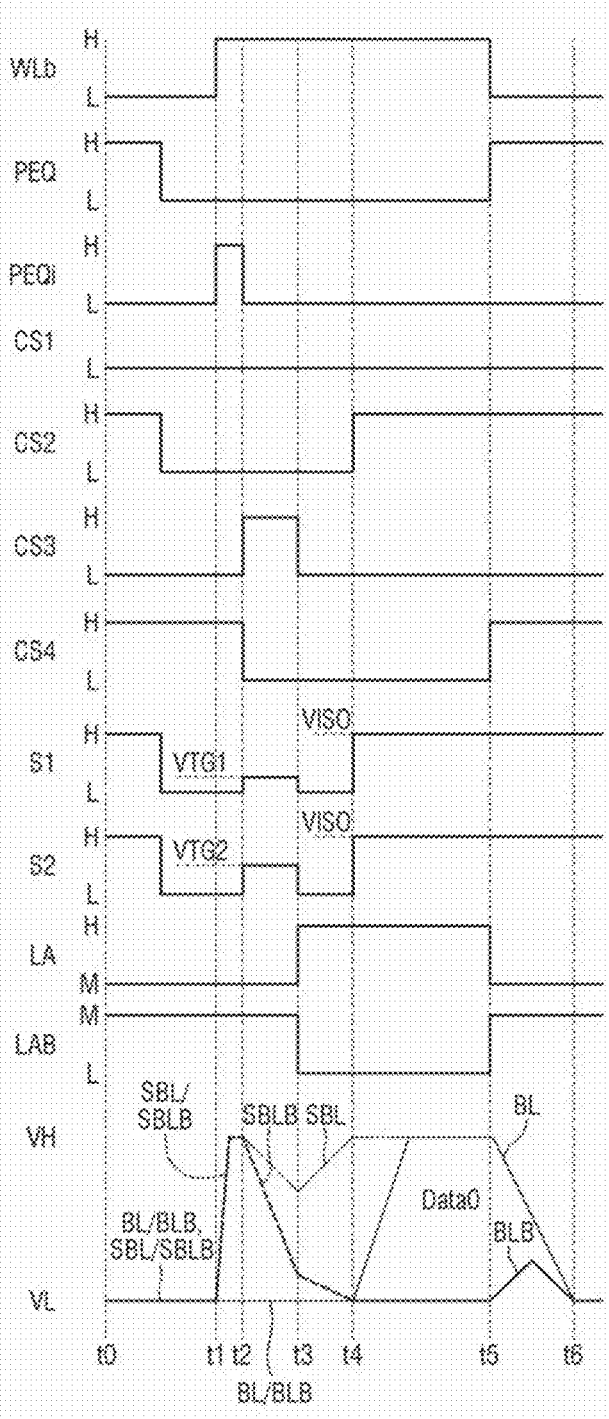

Next, referring to FIGS. 21 and 22, a description will be given of an operation in which the memory cell array 110B of FIG. 21 is activated and the sensing device 200 senses data 0 stored in the memory cells of the memory cell array 110B. FIG. 22 is a timing diagram showing the operation of the bit line sense amplifier BLSA when the memory cell array 110B of FIG. 21 is activated. Hereinafter, differences from the previous embodiment will be mainly explained, and repeated explanations will not be provided.

Referring to FIG. 22, unlike FIG. 14, the voltage provided to the word line WLb may transition from the low level L to the high level H at time t1. As a result, the word line WLb is activated, and the memory cell MC connected to the word line WLb may be selected. Further, at time t2, the control signal CS3 transitions from the logic low L to the logic high H, and each of the transfer gate transistor MN8 and the transfer gate transistor MN12 may be turned on.

According to the connection of the transistors in the interval (t2 to t3), the transfer gate voltage VTG1 is provided to the node N1 through the transfer gate transistor MN8, the charge transfer transistor MN1 is turned on weakly depending on the voltage level of the node N1, and the charge stored in the sensing bit line SBL may be output to the bit line BL through the charge transfer transistor MN1. Further, the transfer gate voltage VTG2 is provided to the node N2 through the transfer gate transistor MN12, the charge transfer transistor MN2 is weakly turned on depending on the voltage level of the node N2, and the charge stored in the sensing complementary bit line SBLB may be output to the complementary bit line BLB through the charge transfer transistor MN2.

In this way, since the bit line BL and the complementary bit line BLB are pre-charged with the low voltage VL, the sensing bit line SBL and the sensing complementary bit line SBLB are pre-charged with the high voltage VH, and the memory cell array 110B is activated, the magnitude of the transfer gate voltage VTG2 applied to the gate of the charge transfer transistor MN2 connected to the activated memory cell array 110B may be greater than the magnitude of the transfer gate voltage VTG1 applied to the gate of the charge transfer transistor MN1 connected to the non-activated memory cell array 110A. As a result, when the charge transfer operation of the bit line sense amplifier BLSA is performed during the interval (t2 to t3), the potential reduction of the sensing complementary bit line SBLB may be greater than the potential reduction of the sensing bit line SBL.

Accordingly, the bit line sense amplifier BLSA may sense data 0 stored in the memory cell MC of the activated memory cell array 110B by sensing the potential difference between the sensing bit line SBL and the sensing complementary bit line SBLB.

Figure 23:
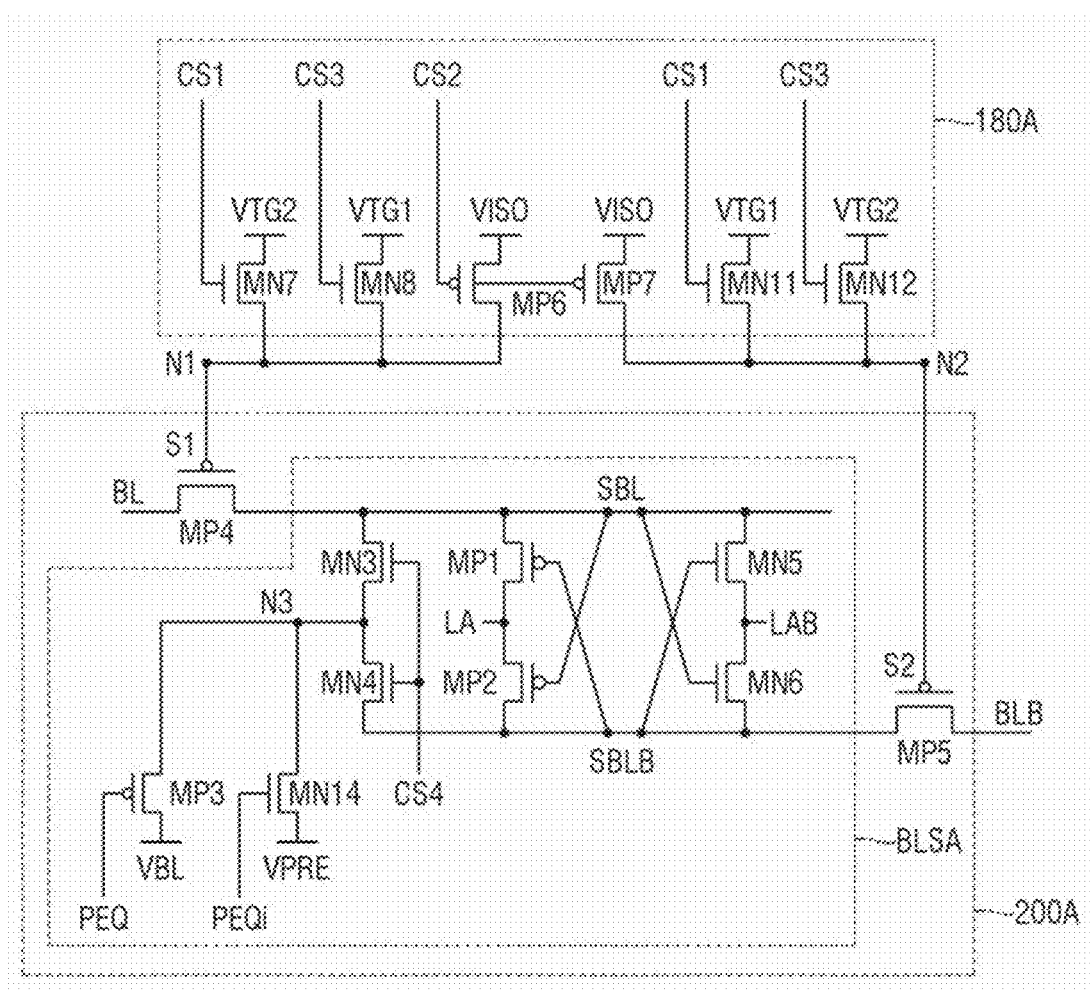
FIG. 23 is a circuit diagram showing a sensing device and a charge transfer transistor driving circuit according to some other embodiments.

FIG. 23 is a circuit diagram showing a sensing device and a charge transfer transistor driving circuit according to some other embodiments. Hereinafter, explanations that overlap those of the previous embodiment will be omitted, and the following explanation will focus on the differences.

Referring to FIG. 23, unlike FIG. 5, the pre-charge transistor MP3 of the sensing device 200A may be implemented as a P-type transistor, and the charge transfer transistor MP4 and the charge transfer transistor MP5 may each be implemented as a P-type transistor. Furthermore, the isolation voltages MP6 and MP7 of the charge transfer transistor driving circuit 180A may be implemented as P-type transistors, respectively.

Figure 24:
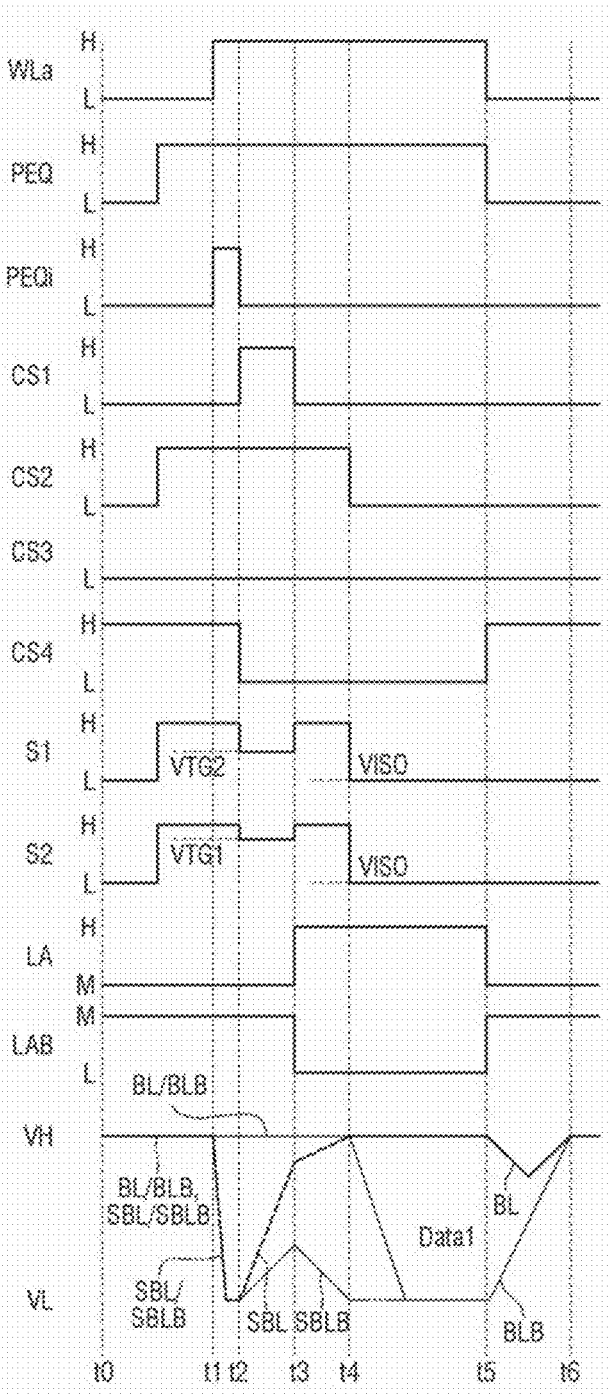
FIGS. 24 and 25 are timing diagrams showing the operation of the bit line sense amplifier of FIG. 23.
Figure 25:
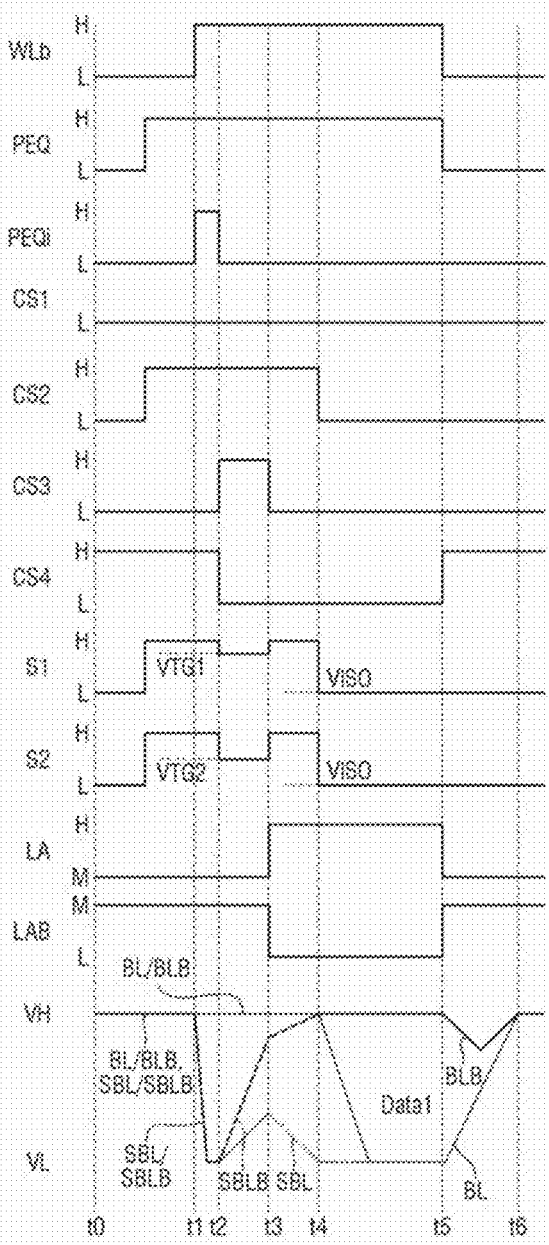

FIGS. 24 and 25 are timing diagrams showing the operation of the bit line sense amplifier of FIG. 23.

First, referring to FIG. 24, FIG. 24 is a diagram for explaining an operation in which the sensing device 200A senses the data 1 stored in the memory cells of the memory cell array 110A, when the memory cell array (e.g., 110A of FIG. 13) connected to the charge transfer transistor MP4 of FIG. 23 is activated, and the memory cell array (e.g., 110B of FIG. 13) connected to the charge transfer transistor MP5 is not activated.

The bit line sense amplifier BLSA may first perform the pre-charge operation at the interval (t0 to t1). The pre-charge equalizing signal PEQ is applied to the gate of pre-charge transistor MP3 at logic low, and the pre-charge transistor MP3 may be turned on to provide the pre-charge voltage VBL through the node N3. At this time, the pre-charge voltage VBL may be a high voltage VH, unlike in FIG. 14. Further, the control signal CS4 is applied to each gate of the equalizing transistors MN3 and MN4 at logic high, and the equalizing transistors MN3 and MN4 may be turned on to pre-charge the sensing bit line SBL and the sensing complementary bit line SBLB with the pre-charge voltage VBL corresponding to the high voltage VH through the nodes N8 and N9, respectively.

In addition, the control signal CS2 is applied to each gate of the isolation transistors MP6 and MP7 at logic low, and each of the isolation transistors MP6 and MP7 may be turned on to provide the isolation voltage VISO to the nodes N1 and N2, respectively. At this time, the isolation voltage VISO may be a ground voltage VSS corresponding to a logic low. The isolation voltage VISO of each of the nodes N1 and N2 may turn on each of the charge transfer transistors MP4 and MP5, connect the sensing bit line SBL and the bit line BL to each other, and connect the sensing complementary bit line SBLB and the complementary bit line BLB to each other. As a result, the bit line BL, the sensing bit line SBL, the complementary bit line BLB, and the sensing complementary bit line SBLB may be pre-charged with the pre-charge voltage VBL corresponding to the high voltage VH.

Thereafter, the bit line sense amplifier BLSA may perform the charge sharing operation at the interval (t1 to t3). Hereinafter, a case where the word line WLa among the word lines (WLa to WLa+n) of the memory cell array 110A (shown in FIG. 13) connected to the charge transfer transistor MP4 is activated will be described as an example.

At time t1, the voltage supplied to the word line WLa may transition from a low level L to a high level H. As a result, the word line WLa is activated, and the memory cell MC connected to the word line WLa may be selected. However, at this time, charge sharing may barely occur between the charge stored in the cell capacitor of the memory cell MC connected to the word line WLa and the charge stored in the bit line BL. For example, since the bit line BL is pre-charged with the high voltage VH (e.g., the power supply voltage VDD) at the interval (t0 to t1), when data 1 is stored in the cell capacitor, there is no potential difference between the cell capacitor and the bit line BL, and thus, the charge sharing operation may barely occur.

On the other hand, the pre-charge equalizing signal PEQi transitions from the logic low L to the logic high H at time t1, and may be applied to the gate of the pre-charge transistor MN14. Accordingly, the pre-charge transistor MN14 may be turned on to provide the pre-charge voltage VPRE through the node N3. At this time, the pre-charge voltage VPRE may correspond to a low voltage VL (e.g., the ground voltage VSS), contrary to the pre-charge voltage VBL corresponding to the high voltage VH.

The pre-charge equalizing signal PEQ transitions from the logic low L to the logic high H during the interval (t0 to t1), and may not provide the pre-charge voltage VBL to the node N3 at time t1. At this time, the control signal CS4 is still in the logic high state, and the equalizing transistors MN3 and MN4 may maintain the turned-on state, and pre-charge the sensing bit line SBL and the sensing complementary bit line SBLB with the pre-charge voltage VPRE corresponding to the low voltage VL through the nodes N8 and N9, respectively.

Further, the control signal CS2 transitions from the logic low L to the logic high H during the interval (t0 to t1), and the charge transfer transistor MP4 and the charge transfer transistor MP5 may be in a turned-off state at time t1. As a result, during the interval (t1 to t2), the bit line BL and the complementary bit line BLB may maintain a pre-charged state with the high voltage VH, and the sensing bit line SBL and the sensing complementary bit line SBLB may be pre-charged with the low voltage VL.

Thereafter, the bit line sense amplifier BLSA may perform a charge transfer operation at the interval (t2 to t3). At time t2, the pre-charge equalizing signal PEQi transitions from the logic high H to the logic low L, and the pre-charge transistor MN14 may be turned off, and thus, the pre-charge voltage VPRE may not be provided to the node N3. Further, the control signal CS1 transitions from the logic low L to the logic high H at time t2, and the transfer gate transistor MN7 and the transfer gate transistor MN11 may be turned on, respectively.

According to connection of the transistors of the interval (t2 to t3), the transfer gate voltage VTG2 is provided to the node NI through the transfer gate transistor MN7, the charge transfer transistor MP4 is turned on weakly depending on the voltage level of the node N1, and the charge stored in the sensing bit line SBL may be output to the bit line BL through the charge transfer transistor MP4. Further, the transfer gate voltage VTG1 is provided to the node N2 through the transfer gate transistor MN11, the charge transfer transistor MP5 is weakly turned on depending on the voltage level of the node N2, and the charge stored on the sensing complementary bit line SBLB may be output to the complementary bit line BLB through the charge transfer transistor MP5.

At this time, since the control signal LA and the control signal LAB have a predetermined intermediate level M voltage, the P-type amplification parts (MP1, MP2 of FIG. 5) and the N-type amplification parts (MN5, MN6 of FIG. 5) do not amplify the amount of charge stored in the sensing bit line SBL and the sensing complementary bit line SBLB. Rather, the P-type amplification parts (MP1, MP2 of FIG. 5) and the N-type amplification parts (MN5, MN6 of FIG. 5) may directly output the amount of charge stored in the sensing bit line SBL and the sensing complementary bit line SBLB at time t2 to the bit line BL and the complementary bit line BLB.

In some embodiments, when the bit line BL and the complementary bit line BLB arc pre-charged with the high voltage VH, the sensing bit line SBL and the sensing complementary bit line SBLB are pre-charged with the low voltage VL, and the charge transfer transistors MP4 and MP5 are implemented as the P-type transistors, the charge transfer voltage VTG2 applied to the gate of the charge transfer transistor MP4 connected to the activated memory cell array 110A may be lower than the charge transfer voltage VTG1 applied to the gate of the charge transfer transistor MP5 connected to the non-activated memory cell array 110B. For example, an absolute value of the magnitude of the charge transfer voltage VTG2 may be greater than an absolute value of the magnitude of the charge transfer voltage VTG1. As a result, when the charge transfer operation of the bit line sense amplifier BLSA is performed during the interval (t2 to t3), the potential increase of the sensing bit line SBL may be greater than the potential increase of the sensing complementary bit line SBLB.

In other words, as described above, when the bit line BL and the complementary bit line BLB are pre-charged with the high voltage VH and data 1 stored in the memory cell MC connected to the bit line BL is sensed, since a sufficient potential difference between the bit line BL and the complementary bit line BLB does not occur after the charge sharing operation, the bit line sense amplifier BLSA may barely sense data 1.

Therefore, in some embodiments, during the charge transfer operation, by applying a lower voltage (e.g., a voltage with a larger absolute value) to the gate of charge transfer transistor MP4 connected to the activated memory cell array 110A, than the voltage applied to the gate of the charge transfer transistor MP5 connected to the non-activated memory cell array 110B, the current driving ability of the charge transfer transistor MP4 during the charge transfer operation of the bit line sense amplifier BLSA may be set to be greater than the current driving ability of the charge transfer transistor MP5. Accordingly, even if the voltage levels of the bit line BL and the complementary bit line BLB after the charge sharing operation are substantially the same, the sensing bit line SBL may perform the charge transfer operation faster than the complementary sensing bit line SBLB, and at time t3, a sufficient potential difference may occur between the sensing bit line SBL and the sensing complementary bit line SBLB. Accordingly, the bit line sense amplifier BLSA may sense the potential difference between the sensing bit line SBL and the sensing complementary bit line SBLB.

The bit line sense amplifier BLSA may perform the sensing operation at the interval (t3 to t4). At time t3, the control signal CS1 transitions from the logic high H to the logic low L, each of the transfer gate transistor MN7 and the transfer gate transistor MN11 may be turned off, and each of the charge transfer transistor MP4 and the charge transfer transistor MP5 may be turned off. Furthermore, at time t3, the control signal LA and the control signal LAB each transition to the logic high H and the logic low L, the P-type amplification parts (MP1 and MP2 of FIG. 5) and the N-type amplification parts (MN5 and MN6 of FIG. 5) may be activated to amplify the amount of charge stored in the sensing bit line SBL and the sensing complementary bit line SBLB, and the voltage according to the amplified amount of charge may be output to the bit line BL and the complementary bit line BLB.

Thereafter, the bit line sense amplifier BLSA may perform the restore operation at the interval (t4 to t5). At time t4, while the control signal CS2 transitions from the logic high H to the logic low L, the isolation transistors MP6 and MP7 may be turned on again, and the isolation voltage VISO is provided to each of the nodes N1 and N2, and the charge transfer transistors MP4 and MP5 may be turned on. The control signals LA and LAB are held similarly to the interval (t3 to t4), and the P-type amplification parts (MP1, MP2 of FIG. 5) and the N-type amplification parts (MN5, MN6 of FIG. 5) may perform the amplification operation. Accordingly, the complementary bit line BLB may be sensed by the charge transfer transistor MP5, transferred to the sensing complementary bit line SBLB, and then discharged as an amplified charge. Meanwhile, the bit line BL may maintain the high voltage VH level.

Subsequently, in the bit line sense amplifier BLSA, the pre-charge equalizing signal PEQ transitions from the logic high H to the logic low L at time t5, the pre-charge transistor MP3 is turned on, the pre-charge operation may be performed again at the interval (t5 to t6), and the bit line sense amplifier BLSA may again sequentially perform the charge sharing operation, the charge transfer operation, the sensing operation, and the restore operation at the interval after t6.

Next, referring to FIG. 25, FIG. 25 is a timing diagram for explaining an operation in which when the memory cell array (e.g., 110B of FIG. 21) connected to the charge transfer transistor MP5 of FIG. 23 is activated, and the memory cell array (e.g., 110A of FIG. 21) connected to the charge transfer transistor MP4 is not activated, the sensing device 200A (shown in FIG. 23) senses the data 1 stored in the memory cells of the memory cell array 110B. Hereinafter, differences from the previous embodiments will be mainly explained, and repeated explanations will not be provided.

Referring to FIG. 25, unlike FIG. 24, the voltage supplied to the word line WLb may transition from the low level L to the high level H at time t1. Accordingly, the word line WLb is activated, and the memory cells MC connected to the word line WLb may be selected. Further, the control signal CS3 transitions from the logic low L to the logic high H at time t2, and the transfer gate transistor MN8 and the transfer gate transistor MN12 may be turned on, respectively.

According to connection of the transistors in the interval (t2 to t3), the transfer gate voltage VTG1 is provided to the node N1 through the transfer gate transistor MN8, the charge transfer transistor MP3 is turned on weakly depending on the voltage level of the node N1, and the charge stored in the sensing bit line SBL may be output to the bit line BL through the charge transfer transistor MP4. Further, the transfer gate voltage VTG2 is provided to the node N2 through the transfer gate transistor MN12, the charge transfer transistor MP5 is weakly turned on depending on the voltage level of the node N2, and the charge stored on the sensing complementary bit line SBLB may be output to the complementary bit line BLB through the charge transfer transistor MP5.

In this way, since the bit line BL and the complementary bit line BLB are pre-charged with the high voltage VH, the sensing bit line SBL and the sensing complementary bit line SBLB are pre-charged with the low voltage VL, and the memory cell array 110B is activated, the transfer gate voltage VTG2 applied to the gate of the charge transfer transistor MP5 connected to the activated memory cell array 110B may be lower than the transfer gate voltage VTG1 applied to the gate of the charge transfer transistor MP4 connected to the non-activated memory cell array 110A. In other words, the absolute value of the magnitude of the charge transfer voltage VTG2 may be greater than the absolute value of the magnitude of the charge transfer voltage VTG1. As a result, when the charge transfer operation of the bit line sense amplifier BLSA is performed during the interval (t2 to t3), the potential reduction of the sensing complementary bit line SBLB may be greater than the potential reduction of the sensing bit line SBL.

Accordingly, the bit line sense amplifier BLSA may sense the data 1 stored in the memory cell MC of the activated memory cell array 110B, by sensing the potential difference between the sensing bit line SBL and the sensing complementary bit line SBLB.

Figure 26:
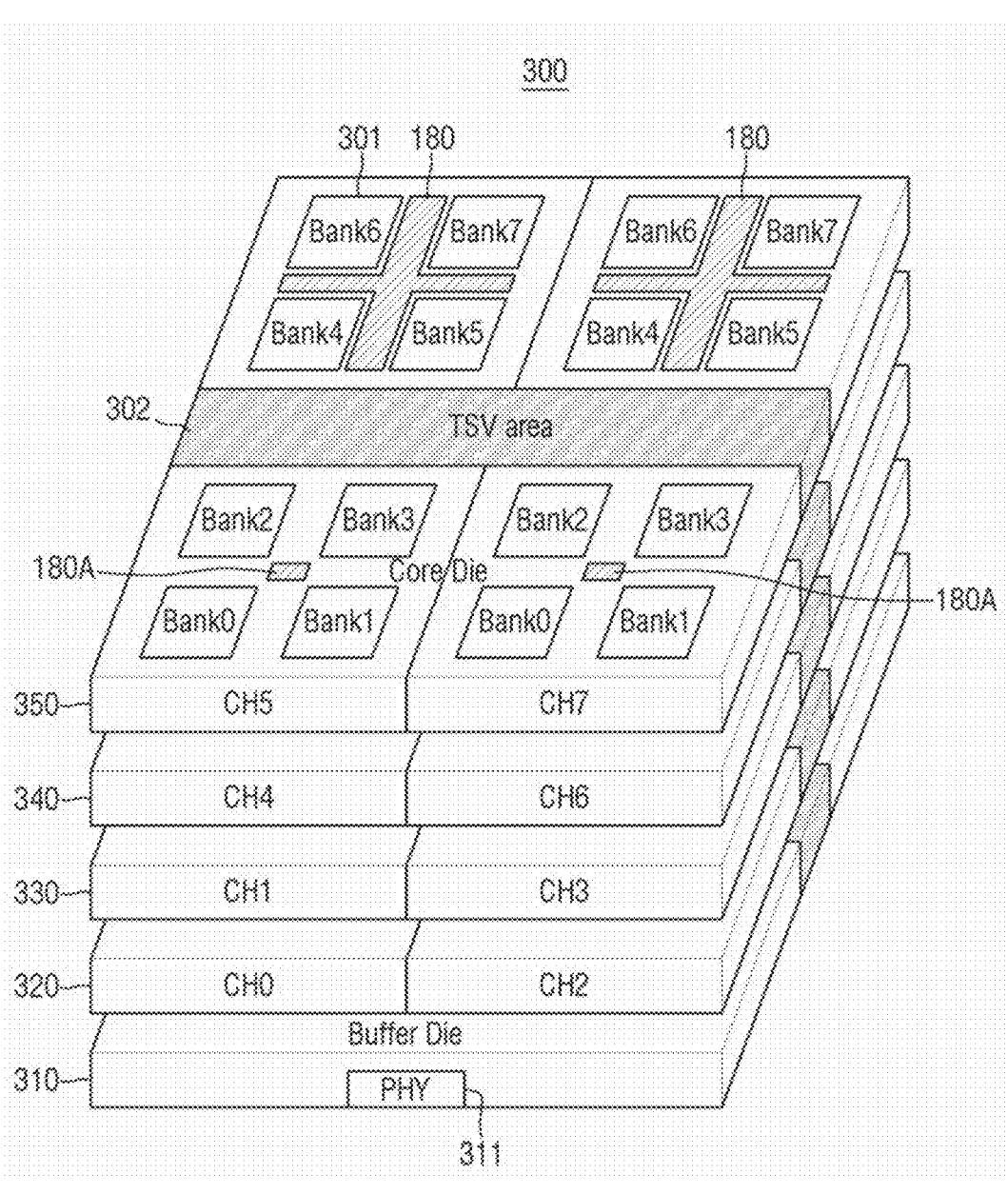
FIG. 26 is a diagram for explaining a stacked memory device according to some embodiments.

FIG. 26 is a diagram for explaining a stacked memory device according to some embodiments.

Referring to FIG. 26, a stacked memory device 300 may include a buffer die 310 and a plurality of core dies 320, 330, 340 and 350. The buffer die 310 may also be referred to as an interface die, a base die, a logic die, a master die, etc., and each of the core dies 320 to 350 may also be referred to as a memory die, a slave die, etc. Although the stacked memory device 300 is shown to include four core dies 320 to 350 in FIG. 26, the number of core dies may be varied. For example, the stacked memory device 300 may include eight, twelve or sixteen core dies.

The buffer die 310 and the core dies 320 to 350 may be stacked and electrically connected through the through silicon vias (TSV). Accordingly, the stacked memory device 300 may have a three-dimensional memory structure in which a plurality of dies 310 to 350 are stacked. For example, the stacked memory device 300 may be implemented on the basis of HBM or HMC standards.

The stacked memory device 300 may support a plurality of functionally independent channels (or vaults). For example, the stacked memory device 300 may support eight channels CH0, CH1, CH2, CH3, CH4, CH5, CH6 and CH7. If each of the channels CH0 to CH7 supports 128 data (DQ) transfer paths (I/O), the stacked memory device 300 may support 1024 data transfer paths. However, the embodiments are not limited thereto, and the stacked memory device 300 may support 1024 or more data transfer paths and may support 8 or more channels (e.g., 16 channels). If the stacked memory device 300 supports 16 channels, each channel may support 64 data transfer paths.

Each of the core dies 320 to 350 may support at least one channel. For example, as shown in FIG. 26, each of the core dies 320 to 350 may support 2 channels (CH0 to CH2, CH1 to CH3, CH4 to CH6, and CH5 to CH7). In this case, the core dies 320 to 350 may support different channels from each other. However, the present disclosure is not limited thereto, and at least two of the core dies 320 to 350 may support the same channel. For example, each of the core dies 320 to 350 may support a first channel CH0.

Each of the channels may constitute an independent command and data interface. For example, each channel may be clocked independently on the basis of independent timing requirements and may not be synchronized with each other. For example, each channel may change a power state or perform a refresh on the basis of an independent command.

Each of the channels may include a plurality of memory banks 301. Each of the memory banks 301 may include memory cells MC (shown in FIG. 2) connected to the word lines WL and the bit lines BL, a row decoder 130 (shown in FIG. 1), a column decoder 140 (shown in FIG. 1), a sense amplifier 150 (shown in FIG. 1), and the like. For example, each of the channels CH0 to CH7 may include eight memory banks 301. However, the present disclosure is not limited thereto, and each of channels CH0 to CH7 may include eight or more memory banks 301. Although FIG. 26 shows that the memory banks included in one channel are included in one core die, the memory banks included in one channel may be distributed by the plurality of core dies. For example, if each of the core dies 320 to 350 supports a first channel CHO, the memory banks included in the first channel CH0 may be distributed to the core dies 320 to 350.

In some embodiments, one channel may be divided into two pseudo channels that operate independently. For example, the pseudo channels may share the channel's command and clock inputs (e.g., the clock signal CK and the clock enable signal CKE), but may independently decode and execute the commands. For example, if one channel supports 128 data transfer paths, each pseudo-channel may support 64 data transfer paths. For example, if one channel supports 64 data transfer paths, each of the pseudo channels may support 32 data transfer paths.

The buffer die 310 and the core dies 320 to 350 may include a through silicon via (TSV) area 302. TSVs configured to pass through the dies 310 to 350 may be placed in the TSV area 302. The buffer die 310 may send and receive signals and/or data to and from the core dies 320 to 350 through the TSVs. Each of the core dies 320 to 350 may send and receive signals and/or data to and from the buffer die 310 and other core dies through the TSVs. In this case, signals and/or data may be sent and received independently through the corresponding TSVs for each channel. For example, if an external host device sends commands and addresses to the first channel CH0 to access the memory cells of the first core die 320, the buffer die 310 may send the control signals to the first core die 320 through the TSVs corresponding to the first channel CH0 to access the memory cells of the first channel CH0.

The buffer die 310 and the core dies 320 to 350 may further include a control logic 114 (shown in FIG. 1). The control logic may control the access to the memory bank 301 on the basis of the command and address signals provided from the memory controller, and generate the control signals for accessing the memory bank 401.

The buffer die 310 and the core dies 320 to 350 may include charge transfer transistor drive circuits 180 and 180A according to the embodiments of FIG. 4 or 23. The charge transfer transistor drive circuits 180 and 180A may be placed or disposed in a conjunction area of the buffer die 310 in some embodiments, and the voltage generator 170 of FIG. 4 may also be placed or disposed in a peripheral circuit area of the buffer die 310.

The buffer die 310 may include a physical layer (PHY) 311. The physical layer 311 may include interface circuits for communicating with external host devices. For example, the physical layer 311 may include interface circuits corresponding to the memory device interface described in FIG.

1. Signals and/or data received through the physical layer 311 may be sent to the core dies 320 to 350 through the TSVs.

In some embodiments, the buffer die 310 may include a channel controller corresponding to each of the channels. The channel controller may manage memory reference operations of the corresponding channel, and may determine timing requirements of the corresponding channel.

In some embodiments, the buffer die 310 may include a plurality of pins for receiving signals from an external host device. The buffer die 310 may receive a clock signal CK, a command/address signal C/A, a write data strobe signal WDQS, and a data signal DQ through the plurality of pins, and send a read data strobe signal RDQS and a data signal DQ. For example, the buffer die 310 may include 2 pins for receiving the clock signal CK, 14 pins for receiving the command/address signal C/A, 8 pins for receiving the write data strobe signal WDQS, 8 pins for sending the read data strobe signal RDQS, and 128 pins for sending and receiving the data signal DQ for each channel.

Figure 27:
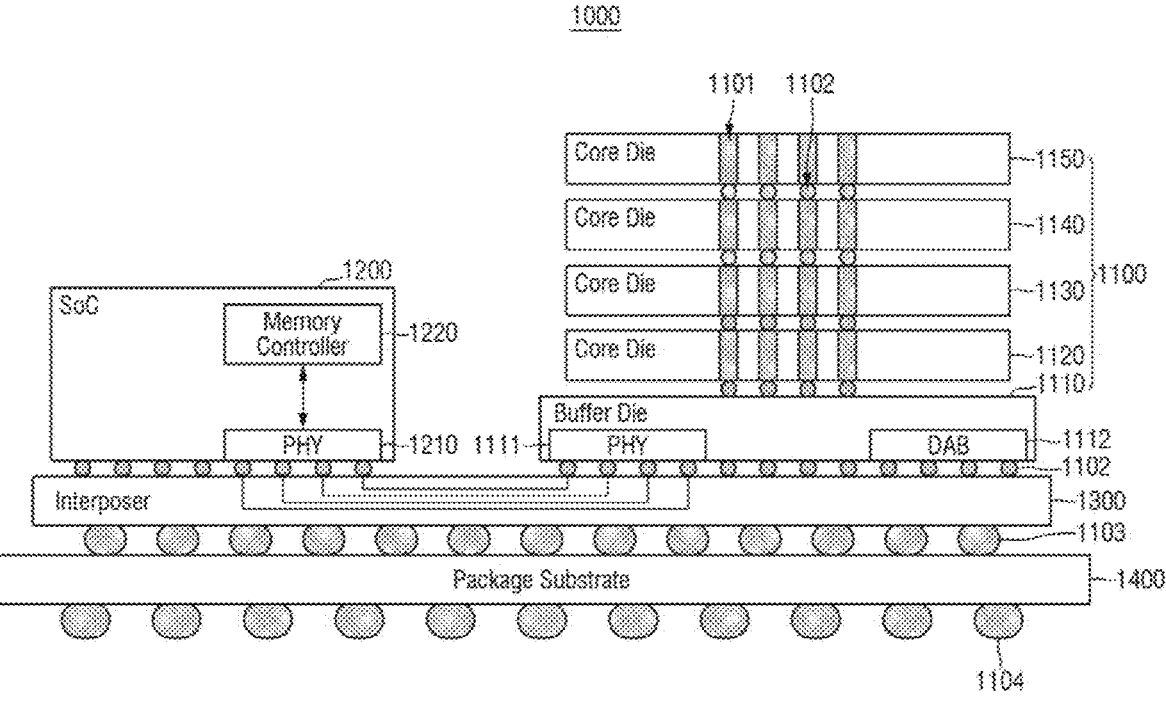
FIG. 27 is a diagram for explaining a semiconductor package according to some embodiments.

FIG. 27 is a diagram for explaining a semiconductor package according to some embodiments.

Referring to FIG. 27, a semiconductor package 1000 may include a stacked memory device 1100, a system-on-chip 1200, an interposer 1300, and a package substrate 1400. The stacked memory device 1100 may include a buffer die 1110 and core dies 1120, 1130, 1140 and 1150. The buffer die 1110 may correspond to the buffer die 310 of FIG. 26, and each of the core dies 1120 to 1150 may correspond to each of the core dies 320 to 350 of FIG. 26.

Each of the core dies 1120 to 1150 may include a memory cell array 110 (shown in FIG. 1). The buffer die 1110 may include a physical layer (PHY) 1111, and an direct access area (DAB) 1112. The physical layer 1111 may be electrically connected to the physical layer 1210 of the system-on-chip 1200 through the interposer 1300. The stacked memory device 1100 may receive signals from or send signals to the system-on-chip 1200 through the physical layer 1111. The physical layer 1111 may include the interface circuits of buffer die 310 described with reference to FIG. 26.

The direct access area 1112 may provide an access path that may be used to test the stacked memory device 1100 without going through the system-on-chip 1200. The direct access area 1112 may include conductive means (e.g., ports or pins) that may communicate directly with the external test device. Test signals and data received through the direct access area 1112 may be sent to the core dies 1120 to 1150 through TSVs 1101. Data read from the core dies 1120 to 1150 for testing the core dies 1120 to 1150 may be sent to the test device through the TSVs 1101 and the direct access area 1112. Accordingly, a direct access test may be performed on the core dies 1120 to 1150.

The buffer die 1110 and the core dies 1120 to 1150 may be electrically connected to each other through the TSV 1101 and the bumps 1102. The buffer die 1110 may receive signals provided to each channel from the system-on-chip 1200 through the bumps 1102 assigned for each channel. For example, an individual one of the bumps 1102 may include micro bumps.

The system-on-chip 1200 may execute applications supported by the semiconductor package 1000, using the stacked memory device 1100. For example, the system-on-chip 1200 may execute specialized computations, by including at least one processor of a Central Processing Unit (CPU), an Application Processor (AP), a Graphic Processing Unit (GPU), a Neural Processing Unit (NPU), a Tensor Processing Unit (TPU), a Vision Processing Unit (VPU), an Image Signal Processor (ISP), and a Digital Signal Processor (DSP).

The system-on-chip 1200 may include a physical layer 1210 and a memory controller 1220. The physical layer 1210 may include I/O circuits for sending and receiving signals to and from the physical layer 1111 of the stacked memory device 1100. The system-on-chip 1200 may provide various signals to the physical layer 1111 through the physical layer 1210. The signals provided to the physical layer 1111 may be transferred to the core dies 1120 to 1150 through the interface circuits of the physical layer 1111 and the TSVs 1101.

The memory controller 1220 may control the overall operation of the stacked memory device 1100. The memory controller 1220 may send the signals for controlling the stacked memory device 1100 to the stacked memory device 1100 through the physical layer 1210.

An interposer 1300 may connect the stacked memory device 1100 and the system-on-chip 1200. The interposer 1300 may connect between the physical layer 1111 of the stacked memory device 1100 and the physical layer 1210 of the system-on-chip 1200, and may provide physical paths formed using the conductive materials. As a result, the stacked memory device 1100 and the system-on-chip 1200 may be stacked on the interposer 1300 to send and receive signals to and from each other.

Bumps 1103 may be attached to an upper part of the package substrate 1400, and solder balls 1104 may be attached to a lower part of the package substrate 1400. For example, the bumps 1103 may be flip-chip bumps. The interposer 1300 may be stacked on the package substrate 1400 through the bumps 1103. The semiconductor package 1000 may send and receive signals to and from other external packages or semiconductor devices through the solder balls 1104. For example, the package substrate 420 may be a printed circuit board (PCB).

Figure 28:
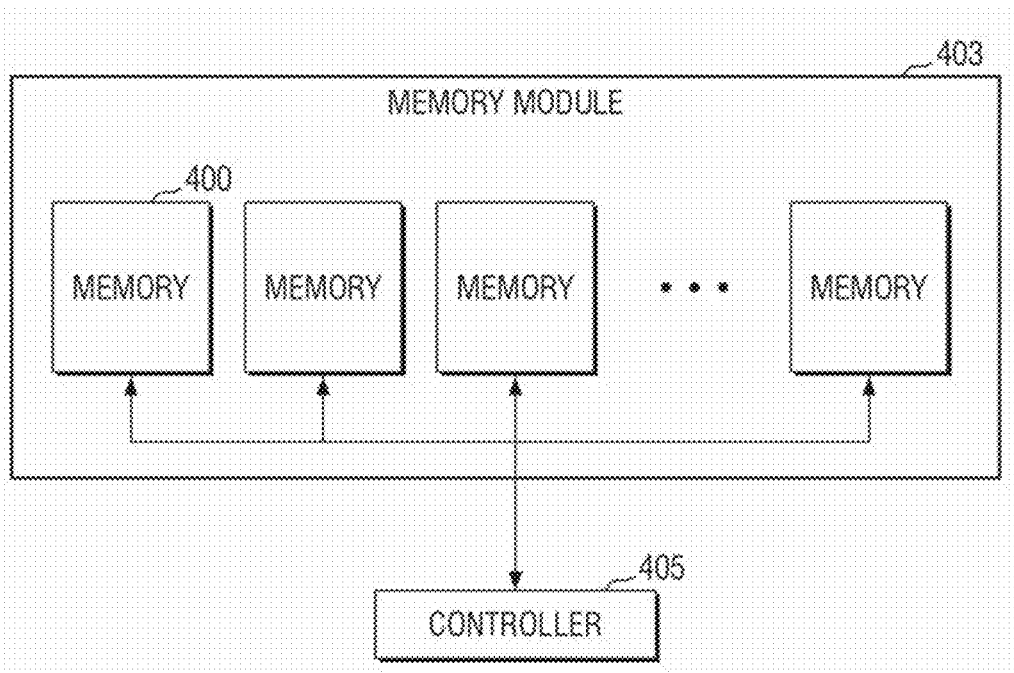
FIG. 28 is a diagram for explaining a memory module and a memory controller including the memory device according to some embodiments.

FIG. 28 is a diagram for explaining a memory module and a memory controller including the memory device according to some embodiments.

FIG. 28 shows a system including a memory controller 405 and a memory module 403. A memory element 400 formed on the memory module 403 may be configured as any one of the embodiments of the disclosure described above.

Figure 29:
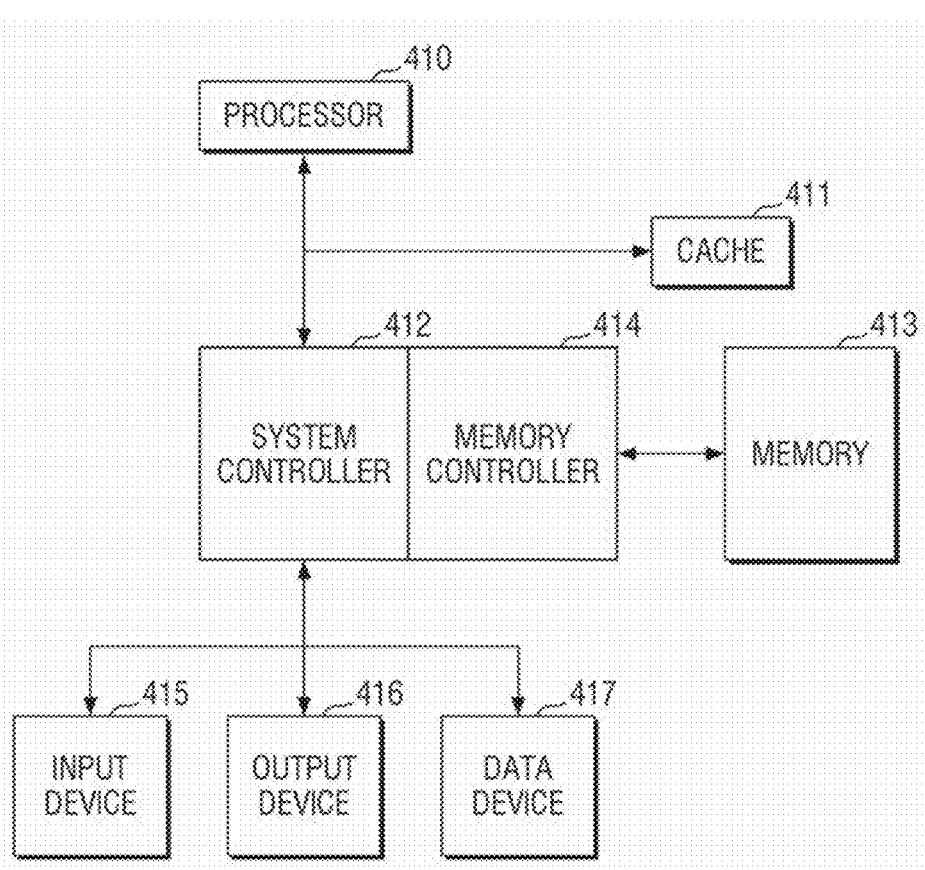
FIG. 29 is a diagram for explaining a computer system including the memory device according to some embodiments.

FIG. 29 is a diagram for explaining a computer system including the memory device according to some embodiments.

FIG. 29 shows an example of the structure of the computer system, and the memory element 413 may be configured as any one of the embodiments of the present disclosure described above. The computer system shown in FIG. 29 may include a processor 410, a cache 411, a system controller 412, a memory controller 414, the memory element 413, an input device 415, an output device 416, and a data storage device 417.

Embodiments of the present disclosure have been described above with reference to the accompanying drawings, but the present disclosure is not limited thereto and may be implemented in various different forms. Therefore, it should be understood that the embodiments set forth herein are illustrative and not limiting.

What is claimed is:

1. A memory device comprising:
a memory cell array that includes a first memory cell connected to a bit line, and a second memory cell connected to a complementary bit line;

a bit line sense amplifier that includes a sensing bit line connected to the bit line, and a sensing complementary bit line connected to the complementary bit line, wherein the bit line sense amplifier is configured to output a signal of the sensing bit line to the bit line and a signal of the sensing complementary bit line to the complementary bit line to sense data stored in the first memory cell and the second memory cell;

a first charge transfer transistor connected between the bit line and the sensing bit line, wherein a gate of the first charge transfer transistor receives a first signal via a first node;

a second charge transfer transistor connected between the complementary bit line and the sensing complementary bit line, wherein a gate of the second charge transfer transistor receives a second signal via a second node;

a first pre-charge transistor that is configured to pre-charge the bit line and the complementary bit line with a first pre-charge voltage;

a second pre-charge transistor that is configured to pre-charge the sensing bit line and the sensing complementary bit line with a second pre-charge voltage different from the first pre-charge voltage;

a first transfer gate transistor that is configured to provide a first transfer gate voltage to a gate of the first charge transfer transistor in response to a first control signal; and a second transfer gate transistor that is configured to provide a second transfer gate voltage different from the first transfer gate voltage to a gate of the second charge transfer transistor in response to the first control signal.

2. The memory device of claim 1, further comprising:
a first isolation transistor that is connected between a first isolation voltage line and the first node, and is turned on in response to a second control signal different from the first control signal to turn on the first charge transfer transistor; and a second isolation transistor that is connected between a second isolation voltage line and the second node, and is turned on in response to the second control signal to turn on the second charge transfer transistor.

3. The memory device of claim 2,
wherein the first isolation transistor is turned on during a first interval and a second interval after the first interval, and the first charge transfer transistor is gated by the first transfer gate voltage during a third interval between the first interval and the second interval.

4. The memory device of claim 3,
wherein the second isolation transistor is turned on during the first and second intervals, and the second charge transfer transistor is gated by the second transfer gate voltage during the third interval.

5. The memory device of claim 1, further comprising:
a third transfer gate transistor that is configured to provide the second transfer gate voltage to the gate of the first charge transfer transistor in response to a second control signal different from the first control signal; and a fourth transfer gate transistor that is configured to provide the first transfer gate voltage to the gate of the second charge transfer transistor in response to the second control signal.

6. The memory device of claim 1, further comprising:
a voltage generator that is configured to generate the first transfer gate voltage and the second transfer gate voltage, wherein the voltage generator is disposed in a peripheral circuit area that is separate from an area in which the memory cell array is disposed.

7. The memory device of claim 1,
wherein a magnitude of the first transfer gate voltage is greater than a magnitude of the second transfer gate voltage, in response to the bit line sense amplifier sensing the data stored in the first memory cell.

8. The memory device of claim 1,
wherein a magnitude of the first transfer gate voltage is smaller than a magnitude of the second transfer gate voltage, in response to the bit line sense amplifier sensing the data stored in the second memory cell.

9. The memory device of claim 1,
wherein the bit line sense amplifier further comprises:
a P-type amplification part that has a first end connected to a first control line to which a third control signal is applied, and a second end connected to the sensing bit line and the sensing complementary bit line; and
an N-type amplification part that has a first end connected to a second control line to which a fourth control signal different from the third control signal is applied, and a second end connected to the sensing bit line and the sensing complementary bit line,
wherein an amplification transistor of the P-type amplification part and an amplification transistor of the N-type amplification part are connected to each other by cross-coupling.

10. A memory device comprising:
a memory cell array that includes a first memory cell connected to a bit line, and a second memory cell connected to a complementary bit line;
a bit line sense amplifier that includes a sensing bit line connected to the bit line, and a sensing complementary bit line connected to the complementary bit line, wherein the bit line sense amplifier is configured to output a signal of the sensing bit line to the bit line and a signal of the sensing complementary bit line to the complementary bit line to sense data stored in the first memory cell and the second memory cell;
a first charge transfer transistor that is connected between the bit line and the sensing bit line, and is gated by a first signal provided to the first node;
a second charge transfer transistor that is connected between the complementary bit line and the sensing complementary bit line, and is gated by a second signal connected to the second node; and
a plurality of transfer gate transistors which
is configured to provide a first transfer gate voltage to a gate of the first charge transfer transistor, and provide a second transfer gate voltage lower than the first transfer gate voltage to a gate of the second charge transfer transistor, in response to the bit line sense amplifier sensing the data stored in the first memory cell, and
is configured to provide the second transfer gate voltage to the gate of the first charge transfer transistor, and provide the first transfer gate voltage to the gate of the second charge transfer transistor, in response to the bit line sense amplifier sensing the data stored in the second memory cell.

11. The memory device of claim 10, further comprising:
a first pre-charge transistor that is connected between a third node between the sensing bit line and the sensing complementary bit line and a first pre-charge voltage line, wherein the first pre-charge transistor pre-charges the bit line and the complementary bit line with a first pre-charge voltage.

12. The memory device of claim 11, further comprising:
a second pre-charge transistor that is connected between the third node and a second pre-charge voltage line, wherein the second pre-charge transistor pre-charges the sensing bit line and the sensing complementary bit line with a second pre-charge voltage different from the first pre-charge voltage.

13. The memory device of claim 12,
wherein a magnitude of the first pre-charge voltage is greater than a magnitude of the second pre-charge voltage.

14. The memory device of claim 10,
wherein the plurality of transfer gate transistors comprise:
a first transfer gate transistor that is connected between the first node and a first voltage line through which the first transfer gate voltage is provided, wherein the first transfer gate transistor is configured to provide the first transfer gate voltage to the first node in response to a first control signal; and
a second transfer gate transistor that is connected between the second node and a second voltage line through which the second transfer gate voltage is provided, wherein the second transfer gate transistor is configured to provide the second transfer gate voltage to the second node in response to the first control signal.

15. The memory device of claim 14,
wherein the plurality of transfer gate transistors further comprises:
a third transfer gate transistor that is connected between the first node and a third voltage line through which the second transfer gate voltage is provided, wherein the third transfer gate transistor is configured to provide the second transfer gate voltage to the first node in response to a second control signal different from the first control signal; and
a fourth transfer gate transistor that is connected between the second node and a fourth voltage line through which the first transfer gate voltage is provided, wherein the fourth transfer gate transistor is configured to provide the first transfer gate voltage to the second node in response to the second control signal.

16. A method for driving a sensing device that is configured to sense data of a first memory cell connected to a bit line, and a second memory cell connected to a complementary bit line, by using a bit line sense amplifier that includes a sensing bit line and a sensing complementary bit line, a first charge transfer transistor connected to the sensing bit line and the bit line, and a second charge transfer transistor connected to the sensing complementary bit line and the complementary bit line, the method comprising:
pre-charging the sensing bit line and the sensing complementary bit line, using a first pre-charge voltage;
providing a first transfer gate voltage to a gate of the first charge transfer transistor, and providing a second transfer gate voltage different from the first transfer gate voltage to a gate of the second charge transfer transistor; and
applying an isolation voltage greater than a magnitude of each of the first and second transfer gate voltages to the gate of the first charge transfer transistor and the gate of the second charge transfer transistor, and sensing data stored in at least one of the first memory cell and the second memory cell.

17. The method for driving the sensing device of claim 16, further comprising:

pre-charging the sensing bit line and the sensing complementary bit line by using the first pre-charge voltage, and at the same time, pre-charging the bit line and the complementary bit line with the first pre-charge voltage by using the first pre-charge voltage; and then applying a second pre-charge voltage different from the first pre-charge voltage to the sensing bit line and the sensing complementary bit line.

18. The method for driving the sensing device of claim 17, wherein a magnitude of the first transfer gate voltage is greater than a magnitude of the second transfer gate voltage, in response to a first word line connected to the first memory cell being activated and a magnitude of the first pre-charge voltage being smaller than a magnitude of the second pre-charge voltage.

19. The method for driving the sensing device of claim 17, wherein an absolute value of the magnitude of the first transfer gate voltage is greater than an absolute value of the magnitude of the second transfer gate voltage, in response to a first word line connected to the first memory cell being activated, and the magnitude of the first pre-charge voltage being greater than the magnitude of the second pre-charge voltage.

20. The method for driving the sensing device of claim 16, wherein the first transfer gate voltage is applied to a gate of the first charge transfer transistor and the second transfer gate voltage is applied to a gate of the second charge transfer transistor during a first interval, the isolation voltage is applied to each of the gate of the first charge transfer transistor and the gate of the second charge transfer transistor during a second interval prior to the first interval, and the isolation voltage is applied to the gate of the first charge transfer transistor and the gate of the second charge transfer transistor during a third interval after the first interval.

\* \* \* \* \*